United States Patent [19]
Kimura

[11] Patent Number: 5,394,012
[45] Date of Patent: Feb. 28, 1995

[54] SEMICONDUCTOR DEVICE AND MANUFACTURING METHOD OF THE SAME

[75] Inventor: Hiroshi Kimura, Hyogo, Japan

[73] Assignee: Mitsubishi Denki Kabushiki Kaisha, Tokyo, Japan

[21] Appl. No.: 136,064

[22] Filed: Oct. 14, 1993

[30] Foreign Application Priority Data

Oct. 22, 1992 [JP] Japan .................................. 4-284581
Jul. 26, 1993 [JP] Japan .................................. 5-184038

[51] Int. Cl.⁶ ...................... H01L 23/48; H01L 29/44; H01L 29/52; H01L 29/60
[52] U.S. Cl. ..................................... 257/739; 257/753
[58] Field of Search ............... 257/753, 739, 617, 621, 257/740

[56] References Cited

U.S. PATENT DOCUMENTS

| | | | |
|---|---|---|---|
| 3,860,949 | 1/1975 | Stoekert et al. | 253/739 |
| 4,829,013 | 5/1989 | Yamazaki | 257/739 |
| 4,922,320 | 5/1990 | McDavid et al. | 257/739 |
| 4,937,653 | 6/1990 | Blonder et al. | 257/739 |

FOREIGN PATENT DOCUMENTS 1-289154  11/1989  Japan .
3-280532  12/1991  Japan .
4-26153   1/1992   Japan .

OTHER PUBLICATIONS

"Two step Deposited Rugged Surface (TDRS) Storagenode and Self Aligned Bitline Contact Penetrating Cellplate (SABPEC) for 64Mb DRAM STC Cell", by Itoh et al., pp. 9–10, '91 VLSI Symp. Tech. Dig.

"A Capacitor-Over-Bit-Line (COB) Cell with A Hemispherical-Grain Storage Node for 64Mb DRAMs", Sakao et al., pp. 655–6658, '90 IEDM Tech. Dig.

"Fabrication of Stacked Capacitors using Rugged Surface Poly-Silicon Film Electrode" by Hayashide et al., Japan Society of Applied Physics, Precedings for '90 Spring Lecture, p. 583.

"Capacitance Enhanced Stacked Capacitor with Engraved Storage Electrode" by Mine et al., Precedings of Joint Lectures of 36th Institution of Applied Physics, p. 668.

"Rugged Surface Poly-Si Electrode and Low Temperature Deposited $Si_3N_4$ for 64MBit and Beyond STC DRAM Cell", Yoshimaru et al., pp. 659–662, '90 IEDM Tech. Dig.

*Primary Examiner*—Edward Wojciechowicz
*Assistant Examiner*—S. V. Clark
*Attorney, Agent, or Firm*—Lowe, Price, LeBlanc & Becker

[57] ABSTRACT

Source/drain diffusion regions are formed at a surface of a silicon substrate, which is substantially flat and has a first surface roughness. Surfaces of the source/drain diffusion regions are covered with a polysilicon film having a surface which has a second surface roughness larger than the first surface roughness. The polysilicon film is removed by etching to expose the surfaces of the source/drain diffusion regions. Owing to this etching for removal, the surfaces of the source/drain diffusion regions have a third surface roughness larger than the first surface roughness.

16 Claims, 38 Drawing Sheets 5,394,012

SEMICONDUCTOR DEVICE AND MANUFACTURING METHOD OF THE SAME

BACKGROUND OF THE INVENTION

1. Field of the Invention

The present invention relates to a semiconductor device and a manufacturing method of the same and, in particular, to a configuration of a surface of a conductive region and a manufacturing method of the same.

2. Description of the Background Art

First, an interconnection structure between a conductive region and an interconnection layer in the prior art will be described below.

FIG. 49 is a schematic cross section showing a connection structure between the conductive region and the interconnection layer in the prior art. Referring to FIG. 49, a MOS (Metal Oxide Semiconductor) transistor 410 is formed in a region of a silicon substrate 401 isolated by an isolating oxide film 403.

The MOS transistor 410 includes a pair of source/drain diffusion regions 409, a gate oxide film 405 and a gate electrode 407. The pair of source/drain diffusion regions 409 are formed on a surface of the silicon substrate 401 with a predetermined space between each other. The gate electrode 407 is formed on a region located between the pair of source/drain diffusion regions 409 with the gate oxide film 405 therebetween. The gate electrode 407 is covered with an insulating film 411.

The MOS transistor 410 is covered with an interlayer insulating film 413 which is formed on the entire surface of the silicon substrate 401. The interlayer insulating film 413 is provided with a contact hole 413a, through which a surface of the source/drain diffusion region 409 is partially exposed. There is formed an interconnection layer 417, which is in contact with the surface of the source/drain diffusion region 409 through the contact hole 413a.

Following disadvantages are caused in the conventional connection structure shown in FIG. 49 due to high integration.

In accordance with miniaturization of elements for the high integration, the conductive regions such as source/drain diffusion regions 409 are inevitably reduced in sizes. Therefore, the contact hole 413a for exposing the surface of the conductive region 409 is reduced in diameter. Accordingly, a contact portion 415a between the interconnection layer 417 and conductive region 409 has a reduced area.

In general, a resistance of the contact portion 415a between the interconnection layer 417 and conductive region 409 depends on the area of the contact portion 415a, and decreases in accordance with the increase of the area. In general, the electric resistance of the contact portion 415a must be about 100Ω or less. However, the contact portion 415a, of which area is reduced due to the miniaturization of the elements for the high integration, has a high resistance in a range from several hundreds Ω to several thousands Ω. The high resistance of the contact portion 415a reduces a current driving capability, and thus reduces an amount of electric charges sent to an element or circuit of the succeeding stage. This reduces operation speed of the element or circuit, and may disable the operation of the element or the like in the worst case.

The above disadvantages due to the high integration may be prevented by the following interconnection structures.

(1) As shown in FIG. 50, a contact portion 415b between the interconnection layer 417 and conductive region 409 has an irregular or uneven configuration, whereby a large contact area is ensured between the interconnection layer 417 and conductive region 409.

(2) As shown in FIG. 51, a local interconnection layer 415c is formed between the interconnection layer 417 and conductive region 409, whereby an area for the contact with the interconnection layer 417 is increased.

In FIGS. 50 and 51, portions corresponding to those in FIG. 49 bear the same reference numerals. The local interconnection layer 415c described in the above item (2) is a conductive layer provided merely between the conductive region 409 and interconnection layer 417.

The method for forming the uneven surface of the semiconductor substrate described in the above item (1) is disclosed in Japanese Patent Laying-Open Nos. 3-280532 (1991) and 4-26153 (1992).

More specifically, Japanese Patent Laying-Open No. 3-280532 discloses a manufacturing method of a semiconductor device having an uneven connection portion between the conductive region and interconnection layer. The manufacturing method will be described below.

FIGS. 52–55 are schematic cross sections showing steps in the manufacturing method of the semiconductor device disclosed in the publication. Referring to FIG. 52, a MOS transistor 510, which includes a pair of source/drain diffusion regions 509, a gate oxide film 505 and a gate electrode 507a, is formed in a region of a silicon substrate 501 isolated by isolated oxide films 503. Thereafter, a protective oxide film 511 covering the MOS transistor 510 is formed on the entire surface of the silicon substrate 501. A photoresist is applied to the surface of the protective oxide film 511, and is patterned, e.g., by photolithography to form a resist pattern 513 having an intended configuration. Using the resist pattern 513 as a mask, etching is effected on the protective oxide film 511. The protective oxide film 511 has contact holes 511a through which the surfaces of the source/drain diffusion regions 509 are partially exposed. Then, the resist pattern 513 is removed.

Referring to FIG. 53, a resist film 515 containing silica film (SOG) is formed by spin coating of mixture liquid of the silica film and thin organic film such as photoresist.

Referring to FIG. 54, anisotropic etching with oxygen plasma is carried out for removing resist component of the resist film 515 containing the SOG, using particles of SOG as a mask 515a. Using the pattern of the particles as the mask 515a, the etching is effected on the surfaces of the silicon substrate 501 exposed through the contact holes 511a.

Referring to FIG. 55, thus the surfaces exposed through the contact holes 511a come to have unevenness 519. Thereafter, the mask 515a is removed. A sputter method is used to deposit an aluminum silicon (AlSi) thin film 517, which is in contact with the source/drain diffusion regions 519 having uneven surfaces through the contact holes 511a. The thin film 517 is patterned, e.g., by photolithography to form an intended interconnection pattern.

In *Precedings of Joint Lectures of* 36th *Institution of Applied Physics* 1989, vol. 2, p. 668, making the surface uneven by a similar method as that disclosed in Japanese Patent Laying-Open No. 3-280532 is disclosed. More specifically, an oxide film and a polycrystalline silicon film are deposited stacked in this order on a silicon substrate, and the surface of the polycrystalline silicon film is made rough by the above described method. The shape of the unevenness formed on the surface of the polycrystalline silicon film has the width of in the range from 0.1 to 0.8 μm and the depth of from 0 to 0.6 μm.

Japanese Patent Laying-Open Publication No. 4-26153 discloses a structure of a semiconductor device which is provided with trenches having uneven surfaces, and a manufacturing method of the same. The structure of the semiconductor device disclosed in this publication may be applied to a memory cell of a trench type, e.g., in a DRAM (Dynamic Random Access Memory). A general structure of the memory cell of the trench type DRAM will be described below.

FIG. 56 is a schematic cross section showing the general structure of the memory cell of the trench type in the DRAM. Referring to FIG. 56, a memory cell of the one-transistor and one-capacitor type is generally employed in the DRAM. Thus, it employs a structure in which one capacitor 620 is electrically connected to one transfer gate transistor 610. This memory cell is formed in a region of a silicon substrate 601 isolated by an isolating oxide film 603.

The transfer gate transistor 610 includes a pair of source/drain diffusion regions 607, a gate oxide film 605a and a gate electrode 617. The pair of source/drain diffusion regions 607 are spaced from each other by a predetermined distance. The gate electrode 617 is formed on a region located between the pair of source/drain diffusion regions 607 with the gate oxide film 605a therebetween.

The capacitor 620 includes the impurity diffusion region 607, a capacitor dielectric film 609 and an electrode layer 611. The silicon substrate 601 is provided with a trench 601b. On the surface of the trench 601b, there is formed the impurity diffusion region 607 which forms one of the electrodes. This impurity diffusion region 607 is formed of one of the source/drain diffusion regions 607, and is electrically connected to the transfer gate transistor 610. The surface of the impurity diffusion region 607 formed on the surface of the trench 601b is covered with a thin capacitor dielectric film 609. The trench 601b is filled with an electrode layer 611, which forms the other of the electrodes and is opposed to the impurity diffusion region 607 with the capacitor dielectric film 609 therebetween. The capacitor 620 is covered with an insulating film 613.

A method for forming the uneven surface of the trench shown in the Japanese Patent Laying-Open No. 4-26153 will be described below.

FIGS. 57-60 are schematic cross sections showing steps in a method for forming the uneven surface of the trench disclosed in the above publication. Referring to FIG. 57, anisotropic plasma etching is effected to a silicon substrate 701 to form a trench 701a. A photoresist 703 is applied to the surface of the silicon substrate 701 and trench 701a. The photoresist 703 is patterned, e.g., by exposure. This exposure is carried out with g-ray (436 nm) and a stepper equipped with NA0.35 lens.

Referring to FIG. 58, the photoresist 703 located on side surfaces of the trench 701a is patterned into wavy forms by standing waves, caused by interference of progressive wave of exposure beam and reflected wave from a wafer during the exposure. A distance between peaks of the wavy form is about 0.2 μm.

Referring to FIG. 59, isotropic etching is effected on silicon, which forms the side surfaces of the trench 701a, with plasma of $CF_4+O_2$. As a result, the trench 701b has the wavy and uneven surfaces at it sides and bottom. Thereafter, the photoresist mask 703b is removed, so that the unevenness is formed on the surface of the trench 701b, as shown in FIG. 60.

As described above, the methods for forming the uneven and rough surface of the semiconductor substrate have been disclosed in the Japanese Patent Laying-Open Nos. 3-280532 and 4-26153.

In the method disclosed in Japanese Patent Laying-Open No. 3-280532, however, it is difficult to determine how the silica film and organic thin film are mixed in the resist 515 containing the SOG. It is particularly difficult to determine the state of mixture when the resist has been applied onto the substrate 501. It is also difficult to control the state of mixture of the silica film and organic thin film-to be an intended state. Therefore, even in the case when only the resist component is removed from the resist 515 and that the particles of SOG are used as the mask 515a, it is very difficult to leave the particles of SOG to have the intended form. For this reason, it is difficult to control the configuration of the unevenness 519 which is formed with the mask 515a formed of the particles of SOG.

In the method disclosed in Japanese Patent Laying-Open No. 4-26153, the exposure beams behave in a complicated manner in the photoresist 703 during the exposure. Therefore, it is difficult to estimate a relationship such as the interference of the progressive wave of exposure beam and the reflected wave from the wafer. For this reason, it is very difficult to control the photoresist 703 for forming the intended uneven configuration by the exposure. Therefore, it is difficult to control the unevenness of the surface of the trench 701b to have the intended configuration.

In the methods disclosed in the publications described above, it is difficult to form the intended uneven surface of the silicon substrate under precise control. Therefore, it is difficult to reduce a contact resistance between the interconnection layer and conductive region and to increase the capacitor capacity under precise control.

In the case when the local interconnection layer 415c is provided, as shown in FIG. 51, a relatively large contact area can be ensured between the interconnection layer 417 and local interconnection layer 415c. Therefore, it is possible to suppress the increase of the contact resistance due to the reduction of the contact area. However, the provision of the local interconnection layer 415c between the interconnection layer 417 and conductive region 409 increases the number of contacts. In other words, the two contact portions are formed between the local interconnection layer 415c and interconnection layer 417 and between the local interconnection layer 415c and conductive region 409 when the local interconnection layer 415c is provided, while only one contact portion is formed between the interconnection layer 417 and conductive region 409 when the local interconnection layer 415c is not provided. The provision of the local interconnection layer 415c increases the number of contacts, and thus increases the contact resistance.

SUMMARY OF THE INVENTION

Therefore, one object of the present invention is to provide a structure in which surface area of a conductive region is increased, and a method of manufacturing such a structure with high controllability.

Another object of the present invention is to provide interconnection structure of a semiconductor device with reduced contact resistance and a method of manufacturing the same.

A further object of the present invention is to provide a method of manufacturing a semiconductor memory device having large capacitor capacitance.

A still further object of the present invention is to provide a method of patterning a conductive layer incurring less degradation of the pattern configuration.

The method of manufacturing a semiconductor device according to one aspect of the present invention includes the following steps: first, a conductive region is formed on a main surface of a semiconductor substrate having a first surface roughness; a coating layer having a surface region having a second surface roughness which is larger than the first surface roughness is formed by vapor deposition on the surface of the conductive region; and the coating layer is removed by etching until the surface of the conductive region is exposed, so that the surface of the conductive region comes to have the third surface roughness which is larger than the first surface roughness.

In the method of manufacturing the semiconductor device, a coating layer having relatively large surface roughness is formed to cover the surface of the conductive region. This coating layer can be formed by selecting prescribed conditions by reduced pressure CVD method, for example, and the surface roughness of the coating layer can be controlled relatively easily. Further, by removing the coating layer by etching, the surface shape of the coating layer can be accurately reflected on the surface of the conductive region. Accordingly, as compared with the prior art, control of the surface roughness of the conductive region after the removal of the coating layer by etching so that it has the desired second surface roughness, is easier. Therefore, the conductive region having the second surface roughness with high controllability is enabled.

The semiconductor substrate and the coating layer should preferably be formed of materials having substantially the same etching characteristics so that the surface shape of the coating layer can be more accurately reflected on the surface of the conductive region.

The conductive region may be formed on a portion of the surface of the semiconductor substrate having the first surface roughness, or it may be formed entirely over the surface of the semiconductor substrate.

The method of manufacturing an interconnection structure of the semiconductor device in accordance with another aspect of the present invention includes the following steps.

First, a conductive region is formed on a main surface of a semiconductor substrate having a first surface roughness; a coating layer having a surface portion with a second surface roughness which is larger than the first surface roughness is formed by vapor deposition on the surface of the conductive region; and the coating layer is removed by etching until the surface of the conductive region is exposed, so that the surface portion of the conductive region comes to have a third surface roughness which is larger than the first surface roughness; and an interconnection layer is formed to be in contact with the surface portion which has the third surface roughness, of the conductive region.

In the method of manufacturing the interconnection structure of the semiconductor device, a coating layer having relatively large surface roughness is formed to cover the surface of the conductive region. The coating layer can be formed by selecting prescribed conditions by using, for example, reduced pressure CVD method, and the control of the surface roughness of the coating layer is relatively easy. In addition, by removing the coating layer by etching, it is possible to accurately reflect the surface shape of the coating layer on the surface of the conductive region. Therefore, as compared with the prior art, control of the surface roughness of the conductive region after the coating layer is removed by etching so that it has a desired second surface roughness, is easier. Therefore, the conductive region having the second surface roughness can be formed with high controllability.

In addition, the semiconductor substrate and the coating layer should preferably be formed of materials having substantially the same etching characteristics so that the surface shape of the coating layer can be more accurately reflected on the surface of the conductive region.

The conductive region may be formed on a portion of the surface of the semiconductor substrate having the first surface roughness, or it may be formed entirely over the surface of the semiconductor substrate.

The interconnection layer is formed to be in contact with the surface of the conductive region having the second surface roughness which is larger than the first surface roughness. Since the surface roughness at the contact between the interconnection layer and the conductive region is relatively large, prescribed contact area is assured even when the planar area of occupation of the contact is decreased as the degree of integration becomes higher. Since the prescribed contact area is assured, increase of contact resistance accompanying the increase of the degree of integration can be prevented.

The interconnection structure of the semiconductor substrate manufactured in the above described method includes a semiconductor substrate, a conductive region, an insulating layer, a conductive layer and an interconnection layer. The semiconductor substrate has a main surface of a first surface roughness. The conductive region is formed on the main surface of the semiconductor substrate and has a surface portion which has a second surface roughness larger than the first surface roughness. The insulating layer is formed on the conductive region and has an opening reaching the surface portion having the second surface roughness. The conductive layer is formed on a sidewall of the opening of the insulating layer. The interconnection layer is formed to be in contact with the surface portion of the conductive region having the second surface roughness, and is formed of a conductive material which is different from the material of the conductive layer.

The interconnection structure of the semiconductor device manufactured by the above described method includes a semiconductor substrate, a conductive region, an insulating layer and an interconnection layer. The semiconductor substrate has a main surface having a first surface roughness. The conductive region is formed in the main surface of the semiconductor substrate and has a surface portion having a second surface roughness which is larger than the first surface roughness. The insulating layer is formed on the conductive region and has an opening reaching the surface portion having the second surface roughness. The interconnection layer is formed on a sidewall of the opening of the insulating layer and is formed to be in contact with the surface portion having the second surface roughness of the conductive region. The region of the interconnection layer on the main surface of the semiconductor substrate has a prescribed width. The surface portion of the conductive region having the second surface roughness which is in contact with the interconnection layer extends at the lower side of the main surface of the semiconductor substrate, and has a width which is larger than the prescribed width of the interconnection layer.

The interconnection structure of the semiconductor device manufactured by the above described method includes a semiconductor substrate, a conductive region, an insulating layer and an interconnection layer. The semiconductor substrate has a main surface having a first surface roughness. The conductive region is formed in the main surface of the semiconductor substrate and has a surface portion having a second surface roughness which is larger than the first surface roughness. The insulating layer is formed on the conductive region and has an opening reaching the surface portion having the second surface roughness. The interconnection layer is formed on the insulating layer to be in contact with the surface portion having the second surface roughness of the conductive region through the opening. The second surface roughness is defined by the unevenness of the surface portion of the conductive region and, the distance between adjacent protruding portions of the unevenness is within the range of from 10 nm to 200 nm, and the difference in level between adjacent depressed portion and protruding portion of the unevenness is within the range of from 5 nm to 100 nm.

Accordingly, in the three interconnection structures of the semiconductor device manufactured in accordance with the above described method, increase of contact resistance accompanying increase of the degree of integration can be prevented.

The method of manufacturing the semiconductor memory device in accordance with a further aspect of the present invention is a method of manufacturing a semiconductor memory device having a trench type capacitor, and it includes the following steps.

First, a trench is formed in the main surface of the semiconductor substrate having a first surface roughness; a conductive region is formed in the surface of the trench; a coating layer having a surface of a second surface roughness which is larger than the first surface roughness is formed by vapor deposition on the surface of the conductive region; the coating layer is removed by etching until the surface of the conductive region is exposed, so that the surface portion of the conductive region comes to have a third surface roughness which is larger than the first surface roughness; a capacitor dielectric film is formed to cover the surface portion having the third surface roughness of the conductive region; and an electrode layer is formed on the capacitor dielectric film.

In the method of manufacturing the semiconductor device, a coating layer having relatively large surface roughness is formed to cover the surface of the conductive region formed in the surface of the trench. This coating layer can be formed by selecting prescribed conditions by, for example, reduced pressure CVD method, and control of the surface roughness of the coating layer is relatively easy. In addition, since the coating layer is removed by etching, the surface shape of the coating layer can be accurately reflected on the surface of the conductive region. Therefore, control of the surface roughness of the conductive region after the coating layer is removed by etching, so that it has a second surface roughness, can be relatively easier as compared with the prior art. Therefore, the conductive region having the second surface roughness can be formed with high controllability. The surface of the conductive region formed in the surface of the trench has third surface roughness which is larger than the first surface roughness. Consequently, opposing areas between electrodes of the capacitor formed by the conductive region and the electrode layer can be increased. Therefore, the capacitor capacitance can be increased, and a prescribed capacitor capacitance is assured even when planar area of occupation is reduced due to higher degree of integration.

The conductive region may be formed at a portion of the surface of the trench, or it may be formed entirely over the surface of the trench.

The method of manufacturing a semiconductor device in accordance with a still further aspect of the present invention includes the following steps.

First, a conductive region is formed on a main surface of a semiconductor substrate having a first surface roughness; a conductive region having a surface portion of a second surface roughness which is larger than the first surface roughness is formed to be in contact with the surface of the conductive region, satisfying the condition that the distance between adjacent protruding portions of the unevenness defining the second surface roughness of the conductive layer is within the range of from 10 nm to 200 nm and that the difference in level between adjacent depressed and protruding portions of the unevenness is within the range of from 5 nm to 100 nm; on the conductive layer, an insulating layer having an opening reaching the surface portion having the second surface roughness of the conductive layer is formed; and an interconnection layer is formed on the insulating layer to be in contact with the surface portion of the second surface roughness of the conductive layer through the opening.

In the method of manufacturing the semiconductor device, the conductive layer is formed to have relatively large surface roughness. The conductive layer can be formed by selecting prescribed conditions by using, for example, reduced CVD method, and control of the surface roughness of the conductive layer is relatively easy. Therefore, the conductive layer having the second surface roughness can be formed with high reliability.

The semiconductor device manufactured by the above described method includes a semiconductor substrate, a conductive region, a conductive layer, an insulating layer and an interconnection layer. The semiconductor substrate has a main surface having a first surface roughness. The conductive region is formed in the main surface of the semiconductor substrate. The conductive layer is formed to be in contact with the conductive region, and has a surface portion which has a second surface roughness larger than the first surface roughness. The insulating layer is formed on the conductive layer and has an opening reaching the surface portion of the second surface roughness of the conductive layer.

The interconnection layer is formed on the insulating layer to be in contact with the surface portion having the second surface roughness of the conductive layer through the opening. The second surface roughness is defined by the unevenness of the surface portion of the conductive region, and the distance between adjacent protruding portions of the unevenness is within the range of from 10 nm to 200 nm and the difference in level between adjacent depressed portion and protruding portion of the unevenness is within the range of from 5 nm to 100 nm.

In the semiconductor device manufactured by the above described method, a conductive layer is formed as a pad layer (local interconnection layer) between the conductive region and a interconnection layer. The surface of the conductive layer has a second surface roughness which is larger than the first surface roughness. Therefore, at the contact portion between the conductive layer and the interconnection layer, the contact area with the interconnection layer is increased when it has the second surface roughness, as compared with the case when it has the first surface roughness, and therefore contact resistance can be reduced. Accordingly, increase of the contact resistance caused by the increase of the number of contacts due to the provision of the conductive layer can be suppressed. This allows higher degree of integration, and the contact resistance can be reduced.

A method of patterning a conductive layer in accordance with a still further aspect of the present invention includes the steps of preparing a substrate structure including a higher region extending to a first height position and a lower region extending to a second height position lower than the first height position extending continuous from the first height position; forming a conductive layer to cover the higher and lower regions; forming a resist on the entire surface of the conductive layer; forming a desired resist pattern by exposing and developing the resist; and patterning the conductive layer by using a resist pattern to form a conductive layer of a prescribed shape at the lower region; in which in order to scatter the light reflected from the conductive layer positioned at the step between the higher region and the lower region at the time of exposing and developing of the resist, the conductive layer is formed to satisfy the conditions that the distance between adjacent protruding portions of the unevenness of the conductive layer surface is within the range of from 10 nm to 200 nm and that the difference in level between adjacent depressed portion and protruding portion of the unevenness is within the range of from 5 nm to 100 nm.

In the method of patterning the conductive layer, the conductive layer to be patterned is formed to have a relatively large surface roughness. Therefore, when the resist on the conductive layer is exposed and developed, the light reflected from the conductive layer position at a step between a higher region and a lower region is scattered. Therefore, convergence or concentration of the reflected light can be prevented, and local increase of the intensity of the reflected light caused by the reflected light concentration can be prevented. Accordingly, degradation of the shape of the resist pattern caused by the local increase of the intensity of the reflected light can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Figure 1:
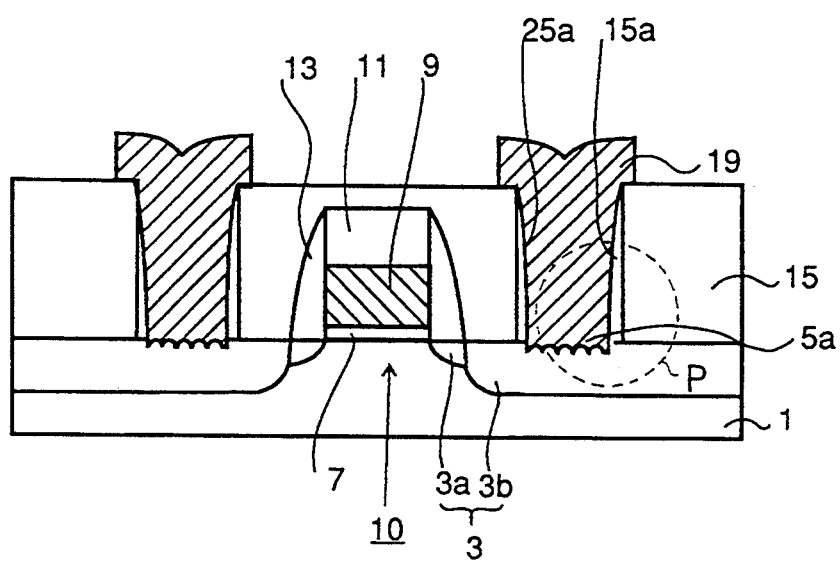
FIG. 1 is a schematic cross section showing an interconnection structure of a semiconductor device of a first embodiment of the invention.

Referring to FIG. 1, a silicon substrate 1 has a substantially flat surface of a first surface roughness. A pair of source/drain diffusion regions 3 are formed at the surface of the silicon substrate 1 with a predetermined space between each other. Each of source/drain diffusion regions 3 has an LDD (Lightly Doped Drain) structure formed of two layers, i.e., an impurity region 3a of a relatively low concentration and an impurity region 3b of a relatively high concentration. A gate electrode 9 is formed on a region located between the pair of source/drain diffusion regions 3 with a gate oxide film 7 therebetween.

On the surface of the gate electrode 9, there is formed an insulating film 11 made of silicon oxide (SiO$_2$). Side surfaces of the gate electrode 9 and insulating film 11 are covered with gate side wall oxide films 13. The pair of source/drain diffusion regions 3, gate oxide film 7, gate electrode 9 and others form a MOS transistor 10.

The MOS transistor 10 is covered with an interlayer insulating film 15 provided with contact holes 15a, through which surfaces of the source/drain diffusion regions 3 are partially exposed. A polysilicon (Poly-Si) film 25a is formed on the side surface of the contact hole 15a. There is formed an aluminum (Al) interconnection layer 19, which is in contact with a part of the surface of the source/drain diffusion region 3 through the contact hole 15a.

A contact portion 5a between the aluminum interconnection layer 19 and silicon substrate 1 has unevenness, in which hemispherical convex portions having diameters in the range from 80 to 100 nm are located continuously in a plane and the difference in level between adjacent depressed and protruding the portions of the surface unevenness is within the range of from about 40 to 50 nm. Thus, the contact portion 5a has the surface rougher than the surface of the silicon substrate 1, and in other words, it has a second surface roughness larger than a first roughness.

Now, a manufacturing method of the interconnection structure of the semiconductor device of the first embodiment will be described below.

Figure 2:
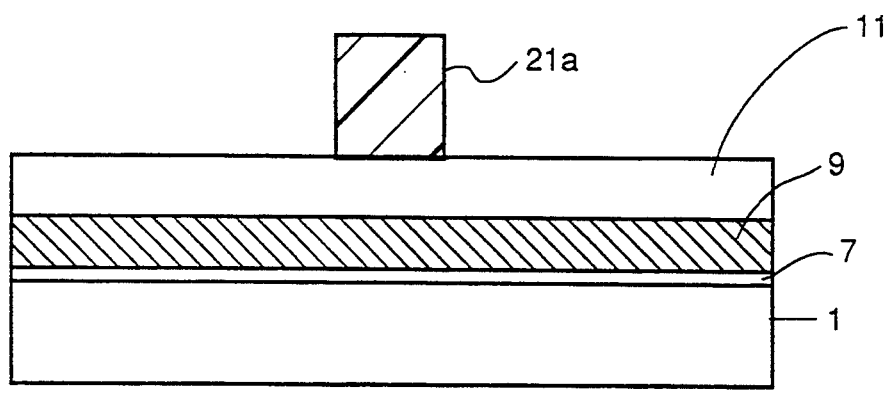
FIGS. 2–11 are schematic cross sections showing steps of a manufacturing method of an interconnection structure of a semiconductor device of a first embodiment of the invention, respectively.

Referring to FIG. 2, the gate oxide film 7 is formed on the substantially flat surface of the silicon substrate 1, e.g., by a thermal oxidation method. The polysilicon film 9 and the insulating film 11 made of silicon oxide are successively formed on the entire surface of the gate oxide film 7. A photoresist is applied to the entire surface of the insulating film 11, and then is patterned into an intended configuration, e.g., by the exposure to form a resist pattern 21a. Using the resist pattern 21a as a mask, the insulating film 11 and polysilicon film 9 are successively etched. Thereafter, the resist pattern 21a is removed.

Figure 3:
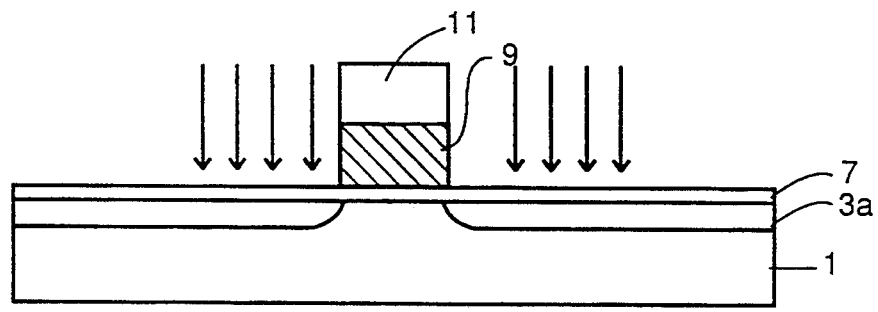

Referring to FIG. 3, this etching results in the gate electrode 9 made of polysilicon. Using a mask formed of the gate electrode 9 and insulating film 11, ions are implanted into the surface of the silicon substrate 1. This forms impurity regions 3a of a relatively low concentration at opposite sides of a region located under the gate electrode 9.

Figure 4:
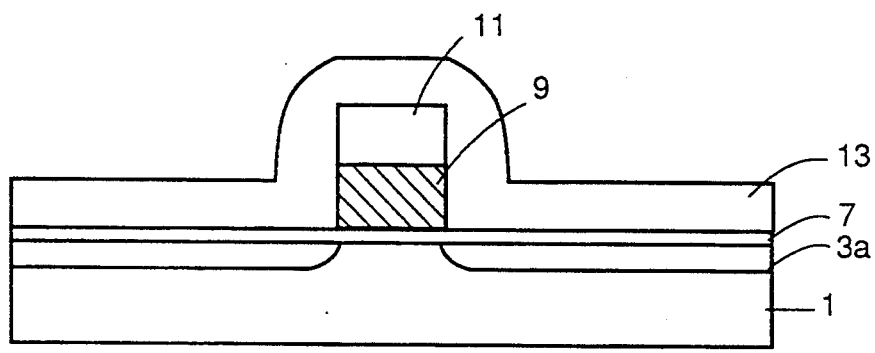

Referring to FIG. 4, the insulating film 13, which covers the gate electrode 9 and insulating film 11 and is made of silicon oxide, is deposited on the entire surface of the-silicon substrate 1. Anisotropic etching, i.e., RIE (Reactive Ion Etching) is effected on the insulating film 13.

Figure 5:
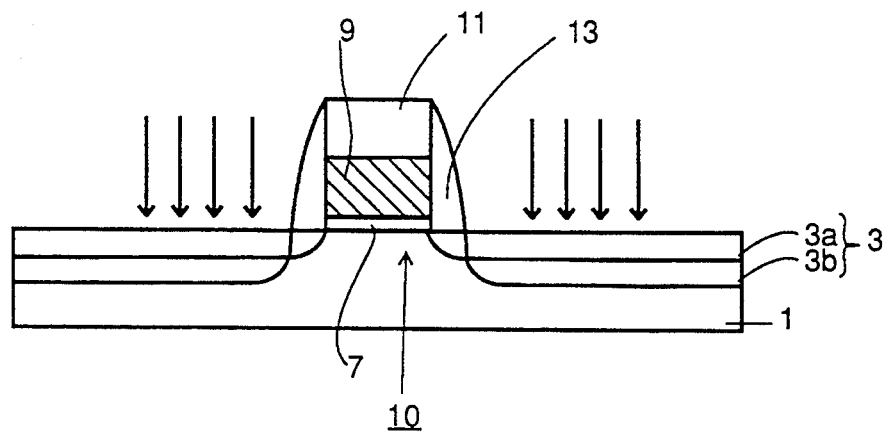

Referring to FIG. 5, by this anisotropic etching the gate side wall oxide films 13 is formed covering the side surfaces of the gate electrode 9 and insulating film 11. Thereafter, ions are implanted into the silicon substrate 1 with a mask formed of the gate electrode 9, insulating film 11 and gate side wall oxide films 13. By this ion implantation the impurity regions 3b are formed which have a relatively high concentration and are in contact with the impurity regions 3a of the relatively low concentration. These impurity regions 3a and 3b of relatively low and high concentrations constitute the pair of source/drain diffusion regions 3 having the LDD structure. Also, the MOS transistor 10 including the pair of source/drain diffusion regions 3, gate oxide film 7 and gate electrode 9 is formed.

Figure 6:
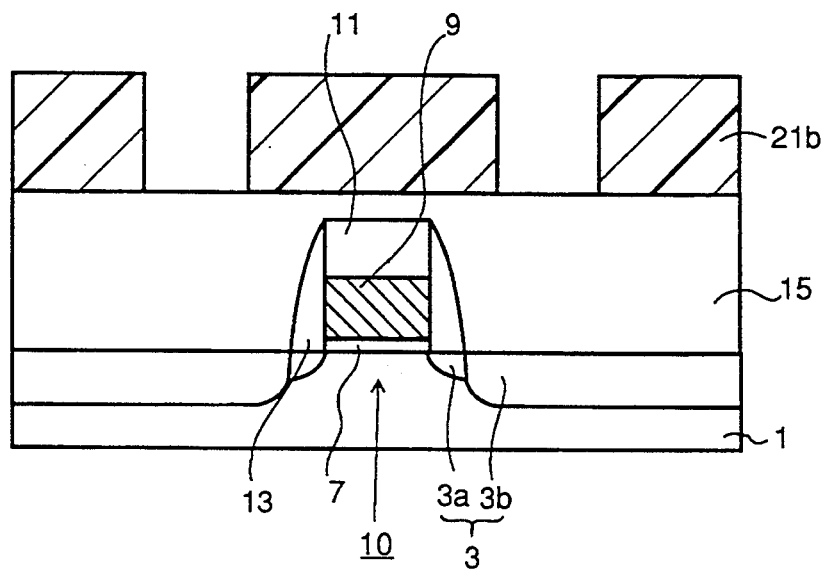

Referring to FIG. 6, the MOS transistor 10 is covered with the interlayer insulating film 15 made of silicon oxide. A photoresist is applied to the entire surface of the interlayer insulating film 15, and is patterned, e.g., by exposure into an intended configuration to form a resist pattern 21b. Using the resist pattern 21b as a mask, the interlayer insulating film 15 is etched to expose the surface of the silicon substrate 1.

Figure 7:
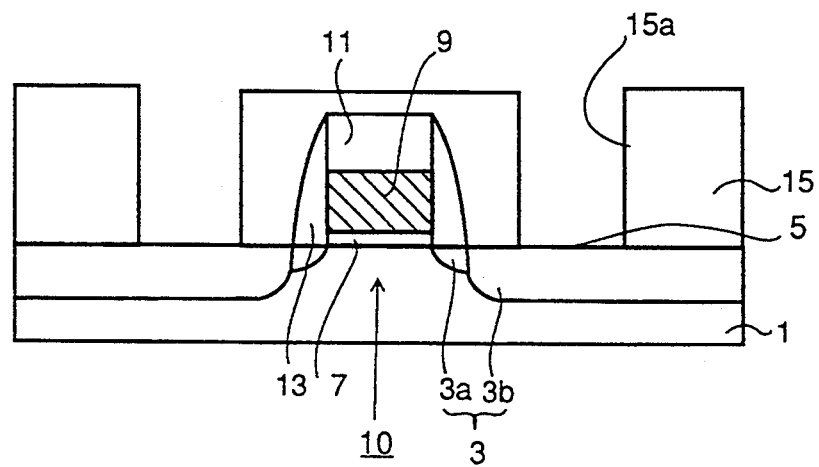

Referring to FIG. 7, by this etching the contact holes 15a are formed in the interlayer insulating film 15. The surfaces of the source/drain diffusion regions 3 are partially exposed through the contact holes 15a. Thereafter, the resist pattern 21b is removed.

Figure 8:
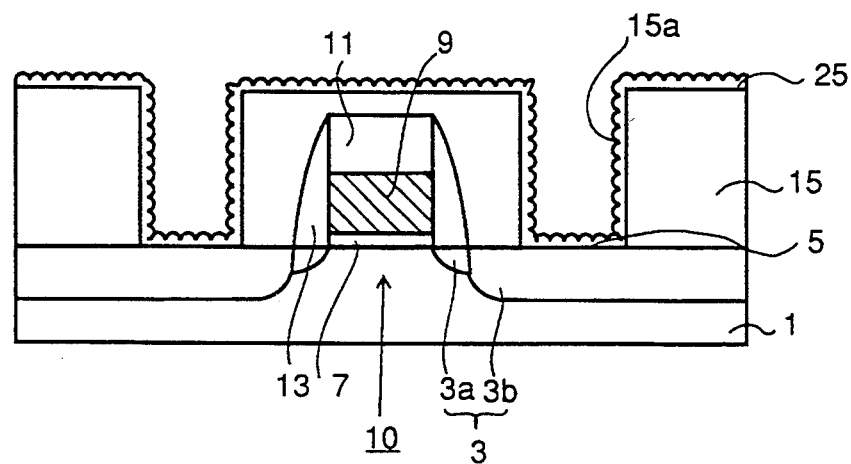

Referring to FIG. 8, a polysilicon film 25 is formed on the surface of the interlayer insulating film 15. The polysilicon film 25 has a thickness in the range from 500 to 1000Å, and is in contact with the surface of the silicon substrate 1 through the contact holes 15a. The polysilicon film 25 is formed by the reduced pressure CVD method under the conditions that the temperature is between 540° and 580° C., the pressure is 1 Torr, the reactive gas is silane (SiH$_4$) diluted with helium (He) and the flow rate thereof is 20%.

Owing to these conditions for forming the polysilicon film 25, hemispherical grains each having a diameter between about 80 and 100 nm are formed at the surface of the polysilicon film 25.

Figure 12:
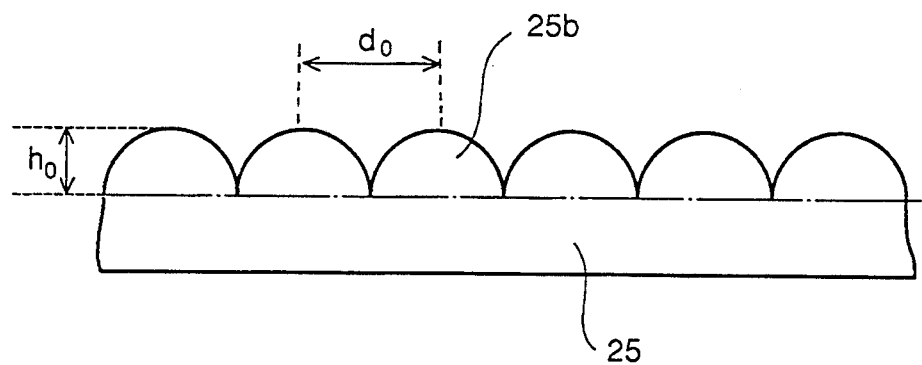
FIG. 12 is a partial cross section schematically showing the structure of the polycrystalline silicon film having a prescribed surface shape.

More specifically, unevenness in the shape of hemispheres 25b between about 80 and 100 nm in diameter such as shown in FIG. 12 continuously disposed are formed on the surface of the polycrystalline silicon film 25. The unevenness has such a shape that the distance $d_0$ between adjacent protruding portions of the unevenness is within the range of from 80 to 100 nm and the difference in level $h_0$ between adjacent depressed and protruding portions is within the range of from 40 to 50 nm.

Then, anisotropic etching is effected on to the polysilicon film 25. This anisotropic etching serves to remove the polysilicon film 25 and over-etch it through 20% of its thickness. Chlorine-contained gas is used for this etching.

Figure 9:
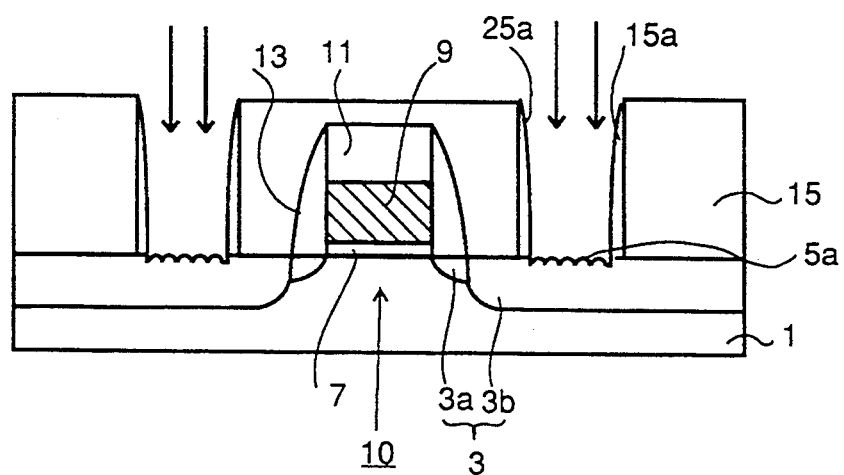

Referring to FIG. 9, polysilicon films 25a remains only on the side surfaces of the contact holes 15a owing to the above etching. Since the silicon substrate 1 has an etch selectivity nearly equal to that of the polysilicon film 25a. Therefore, the anisotropic etching results in unevenness at the surface of the contact portion, which corresponds to the unevenness of the surface of the polysilicon film 25, as shown in FIG. 13.

Figure 13:
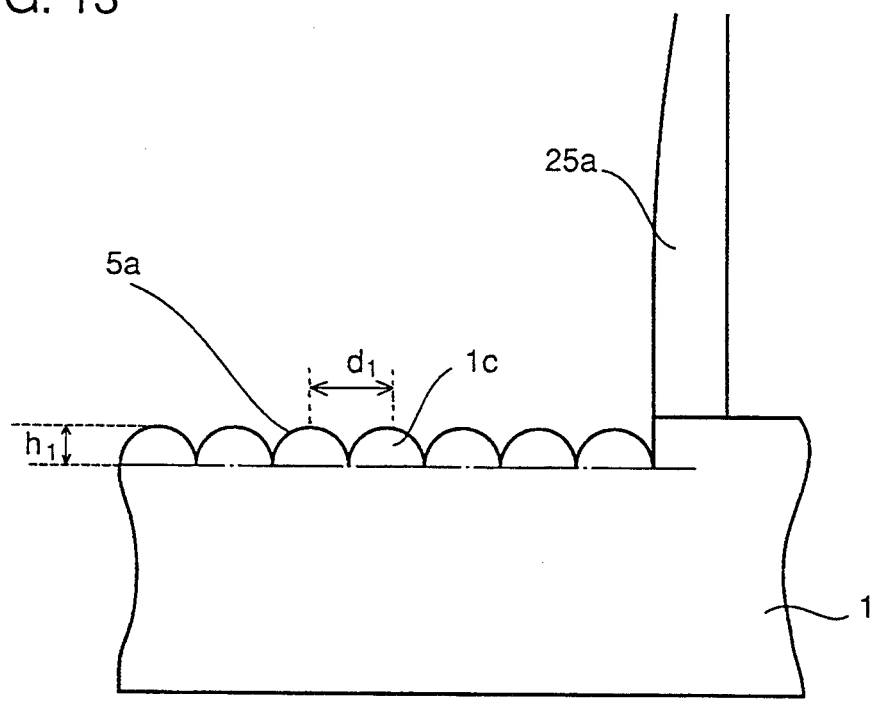
FIG. 13 is a schematic cross section showing, in enlargement, the portion P of FIG. 1.

FIG. 13 is a schematic cross section showing, in enlargement, the portion P of FIG. 1. Referring to FIG. 13, the contact portion 5a of the silicon substrate 1 is provided with unevenness reflecting the unevenness of the surface of the polycrystalline silicon film 25. More specifically, the surface of the contact portion 5a is provided with unevenness in which hemispheres 1c of about 80 to 100 nm in diameter are disposed continuously. The shape of the unevenness is such that the distance $d_1$ between adjacent protruding portions is within the range of from 80 to 100 nm, and the difference in level $h_1$ between the adjacent depressed and protruding portions is within the range of from 40 to 50 nm. Thus the surface of the contact portion 5a comes to have a second surface roughness which is larger than the surface roughness of the silicon substrate 1.

Since the unevenness includes hemispheres 1c disposed continuously, in most cases, the unevenness satisfy $h_1/(d_1/2)=1.0$. Even if this condition is not satisfied, the unevenness satisfies $h_1/(d_1/2) > > 0.5$. More specifically, the difference in level $h_1$ between adjacent protruding and depressed portions of the surface unevenness is at least one fourth of the distance $d_1$ between adjacent protruding portions. By contrast, the unevenness of the surface of the common polycrystalline silicon is defined as about $h_1/(d_1/2)=0.5$. More specifically, the difference in level $h_1$ between adjacent protruding and depressed portions of the surface unevenness is about one fourth of the distance $d_1$ between adjacent protruding portions.

The surface of the interlayer insulating film 15 is hardly etched because it has the etch selectivity which is significantly different from that of the polysilicon film 25a.

Thereafter, impurity is implanted into the uneven surface of the silicon substrate 1 through the contact holes 15a. The purpose of the step of implanting the impurity is to form a junction in a self-alignment manner for preventing positional error of the overlapped and registered mask during the formation of the contact holes, and thus this step is not essential.

Figure 10:
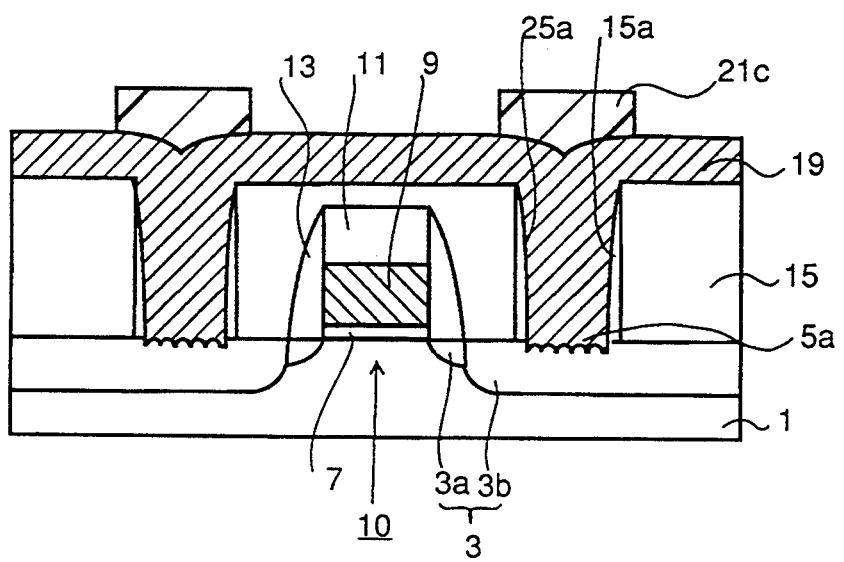

Referring to FIG. 10, the aluminum layer 19, which is in contact with the uneven contact portions 5a of the silicon substrate 1 through the contact holes 15a, is formed on the surface of the interlayer insulating film 15, e.g., by a sputter method. A photoresist is applied to the entire surface of the aluminum layer 19, and then is patterned into an intended configuration, e.g., by exposure to form a resist pattern 21c. Using the resist pattern 21c as a mask, etching is effected on the aluminum layer 19.

Figure 11:
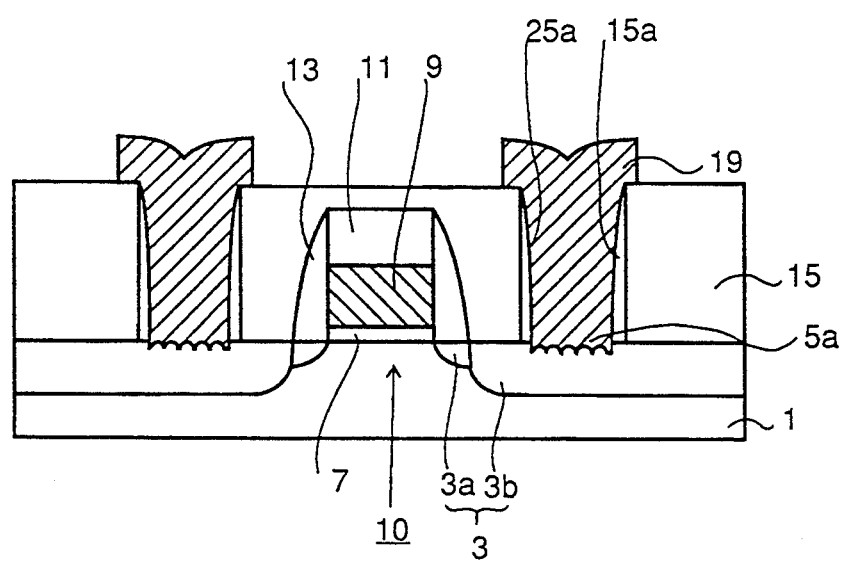

Referring to FIG. 11, this etching completes the aluminum interconnection layer 19, which is in contact with the source/drain diffusion regions 3 through the uneven contact portions 5a. Thereafter, the resist pattern 21c is removed.

The semiconductor device of the first embodiment of the invention is manufactured, as described above.

The conditions for forming the polysilicon film 25 shown in FIG. 8 may not be restricted to those already described, but may be as follows.

Amorphous silicon is deposited on the surface of the interlayer insulating film 15 at a low temperature below 540° C. at a pressure of about 0.2 Torr by the reduced pressure CVD method. By lamp-heating of the amorphous silicon at about 600° C. so as to crystallize the amorphous silicon, similar unevenness formed of hemispherical grains is formed. In this case, however, the diameter of the grain is about 150 nm or less, and the difference in level between the highest and the lowest portion of the convex is about 75 nm or less which is half the diameter. In other words, the distance between adjacent protruding portions does not exceed 150 nm, and the difference in level between adjacent protruding and depressed portions does not exceed 75 nm.

The reduced pressure CVD method is a method of film formation under reduced pressure, and the range of pressure thereof which is generally from 0.1 Torr to 1 Torr.

The amorphous silicon to be lamp-heated may be deposited with disilane ($Si_2H_6$), which is used as the reactive gas in stead of silane ($SiH_4$), in which case unevenness formed of similar hemispherical grains can be obtained. This enables formation of minute grains having a diameter of about 50 nm (the difference in level of the unevenness is about 25 nm). In other words, the distance between adjacent protruding portions is about 50 nm and the difference in level between adjacent protruding and depressed portions is about 25 nm.

According to the theoretical calculation, the diameter of the grain forming the unevenness does not significantly change the surface area of the contact portion. However, increase of the diameter of the hemispherical grain necessarily increases the difference in level between the concave and convex portions, and thus increases an absolute value of variation in the difference in level. If the absolute value of variation of the difference is large, the capacitor dielectric film, which is thinly formed along the uneven surface, has an irregular thickness, and thus has a partially thin portion(s) or a broken portion(s). This causes a disadvantage such as reduction of resistive property against electrical leak in the capacitor. Therefore, in view of the fact that rules for device design such as a contact diameter will be miniaturized, it is preferable to minimize the diameter of hemispherical grains forming the unevenness in order to prevent the influence by the variation in the level difference. For example, the diameter of the hemispherical grain is preferably in a range of several ten times smaller to several times smaller than the contact diameter. Meanwhile, an excessively small diameter of the hemispherical grains forming the unevenness results in a smooth surface, in which case it is difficult to increase the contact area. In view of the foregoing, the diameter of the hemispherical grains forming the unevenness is in a range from 0.01 to 0.2 μm (i.e., from 10 nm to 200 nm)

according to the most advanced current device ruler level (from sub-micron to quarter micron). Thus, the distance between adjacent protruding portions of the unevenness including hemispherical grains is within the range of from 10 nm to 200 nm, and the difference in level between the adjacent depressed and protruding portions of the surface unevenness is within the range of from 5 to 100 nm.

Although the silicon substrate 1 and the aluminum layer 19 are in direct contact in this embodiment, a barrier layer may be provided below the aluminum layer 19.

Figure 14:
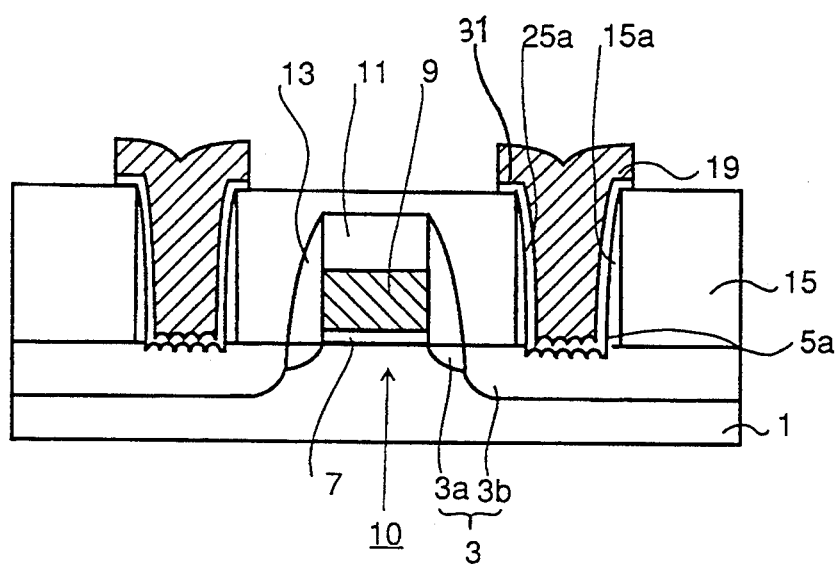
FIG. 14 is a cross section schematically showing the structure when, in the interconnection structure of the semiconductor device of the first embodiment, a barrier layer is formed.

FIG. 14 is a schematic cross section showing a structure including a barrier layer provided below the aluminum layer in the interconnection structure of the semiconductor device in accordance with the first embodiment of the present invention. Referring to FIG. 14, a barrier layer 31 is formed below aluminum layer 19. The barrier layer 31 serves to prevent alloy spikes at the contact portion 5a between aluminum layer 19 and silicon substrate 1 and to improve adhesiveness with the interlayer insulating layer 15.

Figure 15:
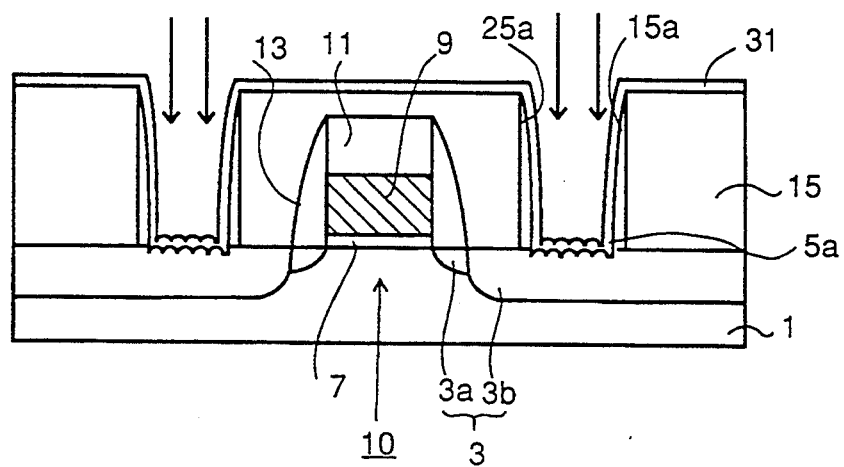
FIGS. 15 and 16 are cross sections showing the steps for forming the barrier layer in the semiconductor device of the first embodiment of the present invention.
Figure 16:
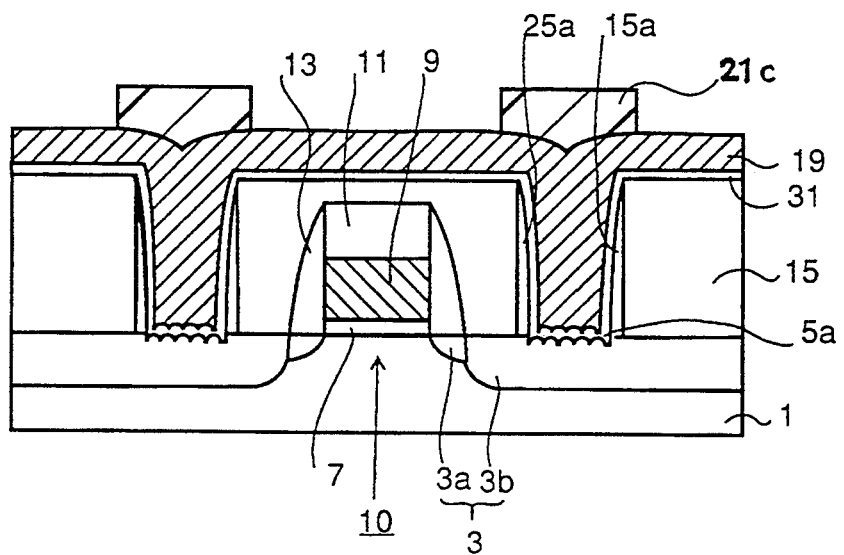

The barrier layer 31 is formed on the entire surface, after the prescribed unevenness is formed at the contact portion 5a as shown in FIG. 15. Then, as shown in FIG. 16, aluminum layer 19 is formed in the similar manner as in the first embodiment. The aluminum layer 19 and the barrier layer 31 are patterned by using a resist pattern 21c, resulting in the state of FIG. 14.

In the manufacturing method of the semiconductor device of the first embodiment, the polysilicon film 25, which is formed in the step shown in FIG. 8, is removed by the anisotropic etching. However, it may be removed by the isotropic etching, in which case a structure shown in FIG. 17 is obtained.

Figure 17:
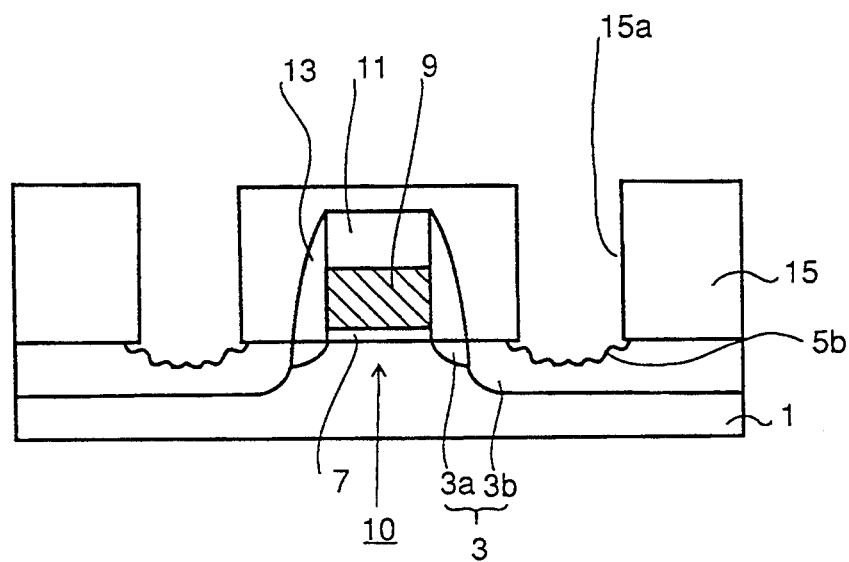
FIG. 17 is a schematic cross section showing a connection portion when a polysilicon film is removed by isotropic etching.

Referring to FIG. 17, in the case of the isotropic etching, the polysilicon film does not remain on the side surfaces of the contact holes 15a. Portions of the silicon substrate below the interlayer insulating film 15 are recessed by about 100 to 200Å. The convex and concave portions formed in the contact portion 5b are of gentle hemispherical shapes, and in other words, have small radii of curvature, compared with those formed by the anisotropic etching. For this reason, while the anisotropic etching can increase the contact area about 1.5 or 2.0 times, compared with the relatively flat contact portion in the prior art, the isotropic etching can increase the contact area only about 1.5 time. After removing the polysilicon film 25a in FIG. 8 by the isotropic etching, steps similar to those after the anisotropic etching are carried out, whereby the semiconductor device has the structure shown in FIG. 18.

Figure 18:
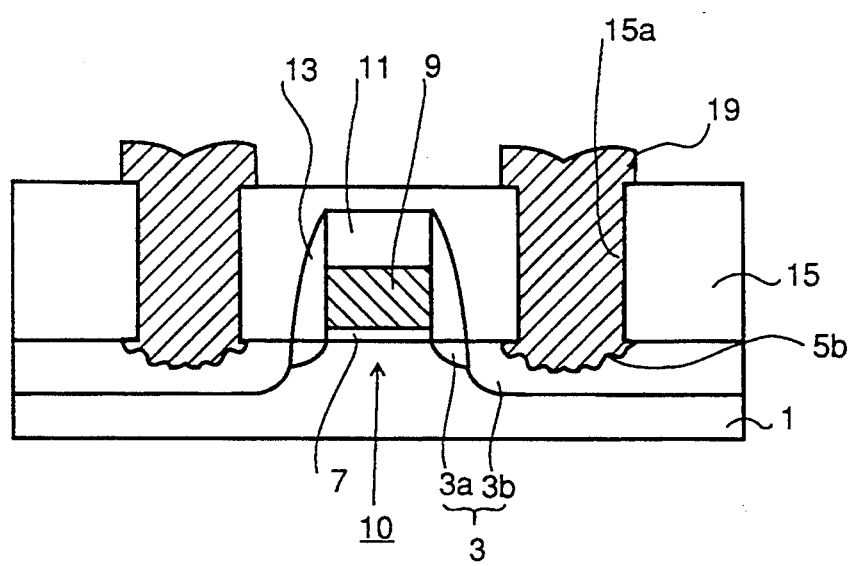
FIG. 18 is a schematic cross section showing an interconnection structure of a semiconductor device formed by removing a polysilicon film by isotropic etching.

In the interconnection structure of the semiconductor device of the first embodiment, the relatively rough unevenness is formed at the contact portion 5b between the conductive region 3 and the interconnection layer 19, as shown in FIGS. 1 and 18. Therefore, the contact area between the conductive region 3 and the interconnection layer 19 can be increased, and thus the contact resistance can be reduced.

Figure 19:
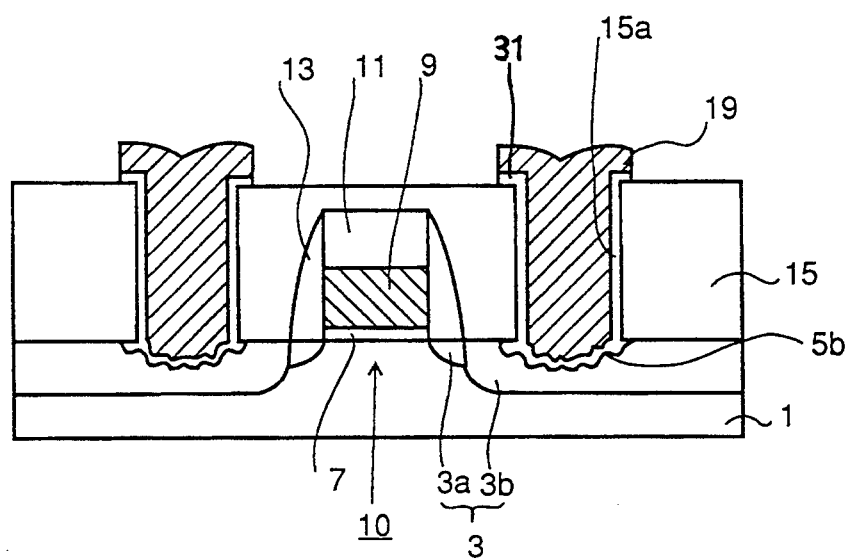
FIG. 19 is a schematic cross section showing a structure in which a barrier layer is formed with the unevenness formed by isotropic etching.

Barrier layer 31 may be provided as shown in FIG. 19, when the unevenness is provided at the contact portion 5b by isotropic etching. In this case also, the barrier layer 31 serves to prevent alloy spike at the contact portion 5b between aluminum layer 19 and silicon substrate 1, and to improve adhesiveness of insulating layer 15 and aluminum layer 19.

Now, structures of a semiconductor device of a second embodiment of the invention will be described below.

Figure 20:
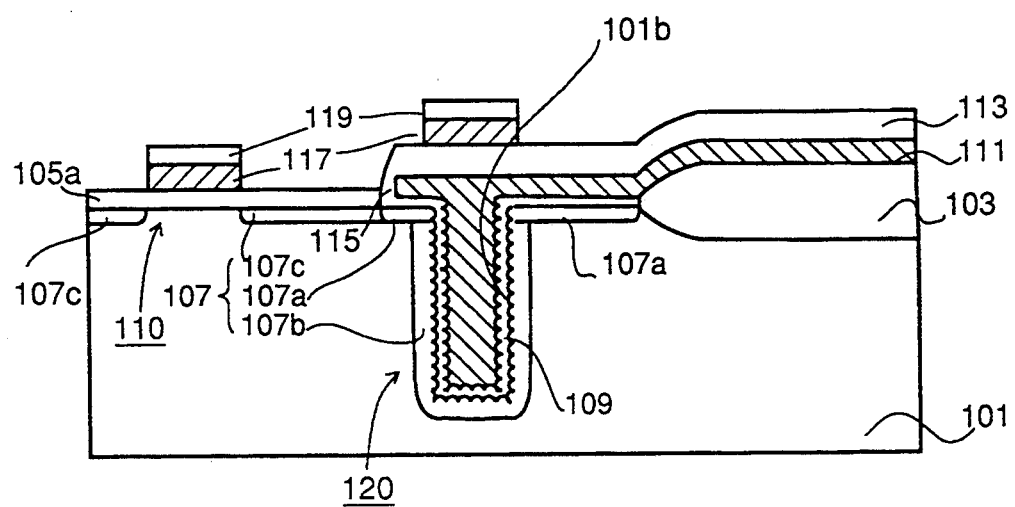
FIG. 20 is a schematic cross section showing a semiconductor memory device of a second embodiment of the invention.

Referring to FIG. 20, a silicon substrate 101 has a substantially flat surface having a first surface roughness. A memory cell of a DRAM is formed in a region of the silicon substrate 101 isolated by an isolating oxide film 103. The memory cell is of a trench type and is formed of one transistor and one capacitor. Thus, one MOS transistor 110 is electrically connected to one capacitor 120 of the trench type.

The MOS transistor 110 includes a pair of impurity regions 107c forming source/drain diffusion regions, a gate oxide film 105a and a gate electrode (word line) 117. The pair of impurity diffusion regions 107c are formed at the surface of the silicon substrate 101 with a predetermined space between each other. On the region between the pair of impurity diffusion regions 107c is formed the gate electrode 117 with the gate oxide film 105a therebetween. An insulating film 119 of silicon oxide ($SiO_2$) is formed on the surface of the gate electrode 117.

The capacitor 120 includes electrodes 107a and 107b, which functionally form one electrode, a capacitor dielectric film 109 and an electrode 111, which forms the other electrode. The impurity diffusion regions 107a and 107b, forming functionally one electrode, are formed at an inner surface of a trench 101b formed at the surface of the silicon substrate 101. The inner surface of the trench 101b in which the impurity diffusion regions 107a and 107b serving as one electrode are formed, has unevenness which is rougher than that of the surface of the silicon substrate 101. Thus, the inner surface of the trench 101b has a second surface roughness larger than that of the surface of the silicon substrate 101. The uneven surface of the trench 101b is covered with the capacitor dielectric film 109 extending along the uneven surface. The trench 101b is filled with the polysilicon film 111, i.e., the other electrode, which is opposed to the impurity diffusion regions 107a and 107b with the capacitor dielectric film 109 therebetween. The capacitor 120 is covered with insulating films 113 and 115 formed of silicon oxide.

One of the paired impurity diffusion regions 107c forming the MOS transistor 110 is electrically connected to the impurity diffusion region 107a, i.e., one of the electrodes of the capacitor 120. Thus, the MOS transistor 110 and the capacitor 120 are electrically connected together, constituting the memory cell.

A manufacturing method of the semiconductor memory device of the second embodiment will be described below.

Figure 21:
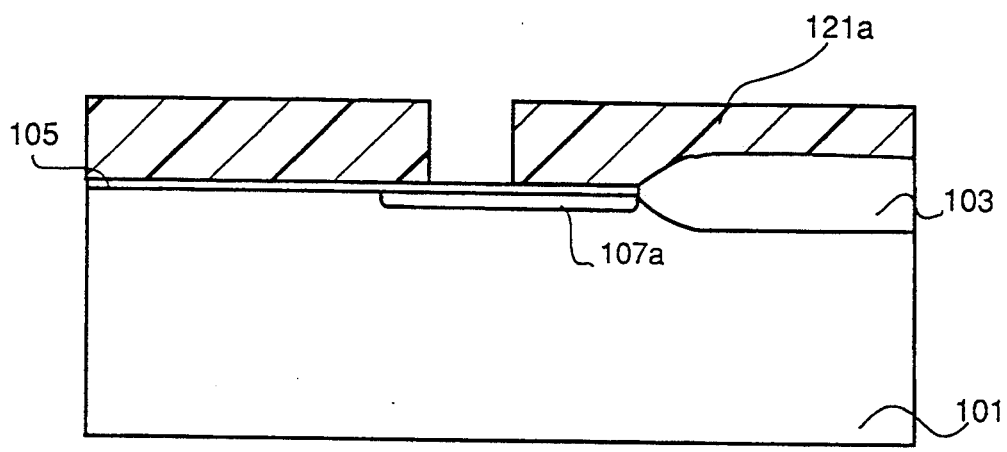
FIGS. 21–32 are schematic cross sections showing steps of a manufacturing method of a semiconductor memory device of a second embodiment of the invention, respectively.

Referring to FIG. 21, an LOCOS (Local Oxidation of Silicon) method is used to form the isolating oxide film 103 in the substantially flat surface of the silicon substrate 101 having the first surface roughness. The impurity diffusion region 107a is formed in the surface of the silicon substrate 101 isolated by the isolating oxide film 103. The thin silicon oxide film 105 is formed on the silicon substrate 101. Thereafter, a photoresist is applied to the entire surface of the silicon substrate 101, and then is patterned, e.g., by exposure to form an intended resist pattern 121a. Using the resist pattern 121a as a mask, etching is effected on the silicon substrate 101.

Figure 22:
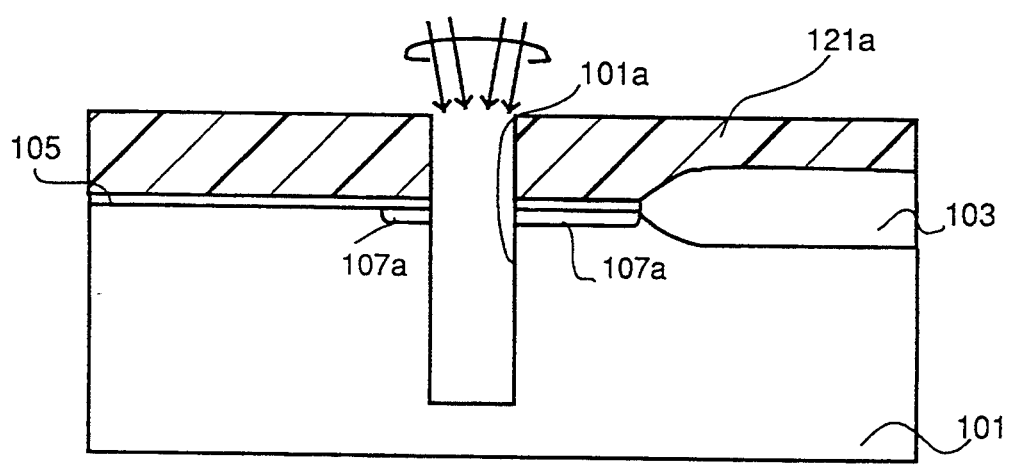

Referring to FIG. 22, by this etching the trench 101a is formed in the silicon substrate 101. Without removing the resist pattern 121a, an oblique rotational implant method is used to implant ions into the surface of the trench 101a at an angle of about 10 degrees. Thereafter, the resist pattern 121a is removed.

Figure 23:
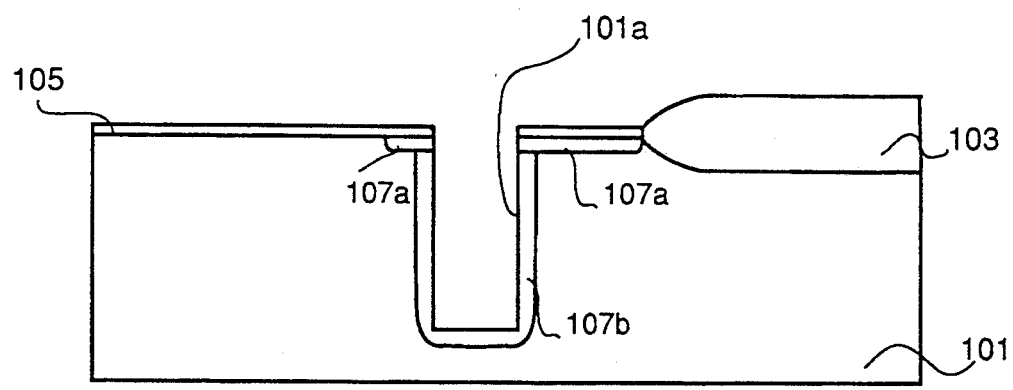

Referring to FIG. 23, by the oblique rotary implanting method the impurity diffusion region 107b of the same conductivity type as the impurity diffusion region 107a is formed in the inner surface of the trench 101a.

Figure 24:
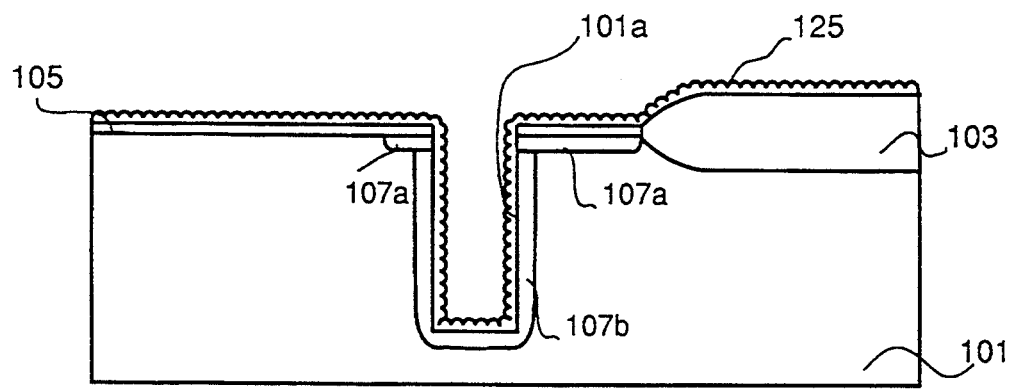

Referring to FIG. 24, a polysilicon film 125 is formed on the surface of the silicon substrate 101. The polysilicon film 125 covers the surfaces of the impurity diffusion regions 107a and 107b formed at the inner surface of the trench 101a. The polysilicon film 125 is formed, e.g., by a reduced pressure CVD method under the conditions of a temperature between 540° and 580° C., a pressure of 1 Toor, and reactive gas of silane ($SiH_4$) diluted with helium (He) at a flow rate of 20%. Thus, the surface of the polysilicon film 125 is roughened to have the unevenness, in which hemispherical portions between 80 and 100 nm in diameter are disposed continuously with difference in level between adjacent depressed and protruding portions of the surface unevenness being in the range of from about 40 to 50 nm. The polysilicon film 125 thus roughened is removed by the isotropic plasma etching.

Figure 25:
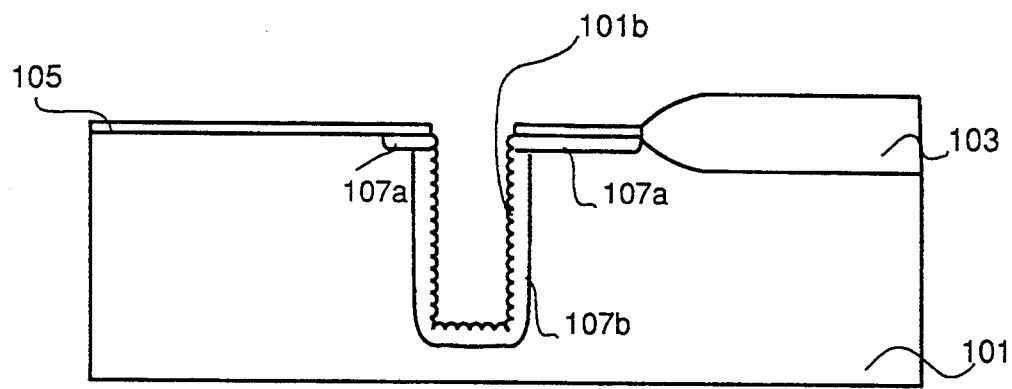

Referring to FIG. 25, by this etching the unevenness, which corresponds to the surface configuration of the polysilicon film 125, is formed in the surface of the silicon substrate 101 having an etch selectivity substantially similar to that of the polysilicon film 125. Thus, the unevenness having the second surface roughness larger than the first surface roughness is formed on the surfaces of the impurity diffusion regions 107a and 107b formed at the surface of the trench 101b. Thus, one electrode of the capacitor having the uneven surface is formed. Since the isolating oxide film 103 and silicon oxide film 105 have etch selectivity which are quite different from that of the polysilicon film, the surfaces of the films 103 and 105 are hardly etched by the etching of the polysilicon film 125. Therefore, the isolating oxide film 103 and silicon oxide film 105 have relatively smooth and flat surfaces.

Figure 26:
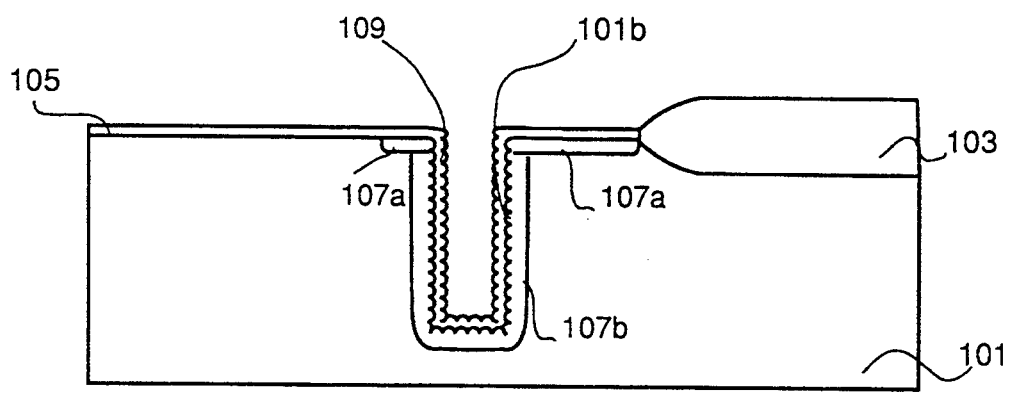

Referring to FIG. 26, the capacitor dielectric film 109, which is formed of silicon oxide ($SiO_2$) or silicon nitride ($SiN_4$), is deposited on the surface by the CVD method. This capacitor dielectric film 109 extends along the unevenness of the surfaces of the impurity diffusion regions 107a and 107b formed at the inner surface of the trench 101b, and covers the surfaces of the regions 107a and 107b. Since the capacitor dielectric film 109 is relatively thin, its surface has unevenness reflecting the unevenness of the impurity diffusion regions 107a and 107b.

Figure 27:
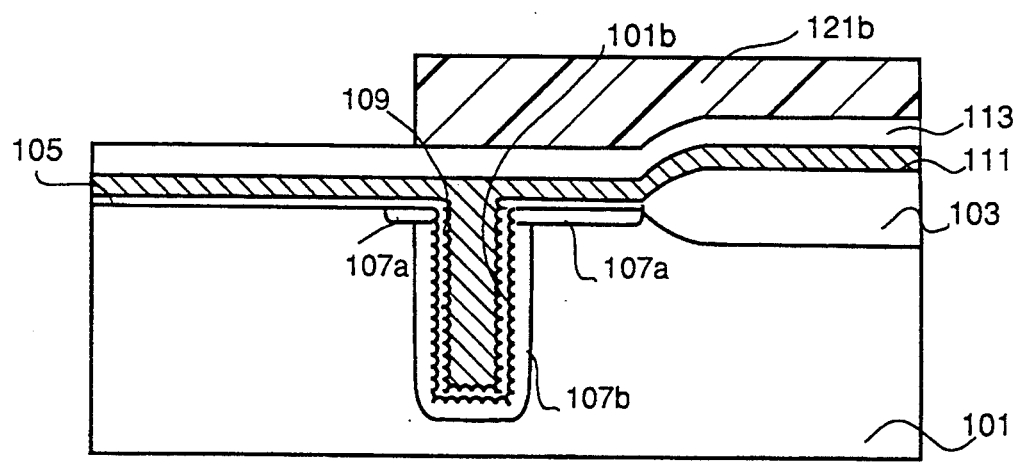

Referring to FIG. 27, the trench 101b is filled with the polysilicon film 111, which is formed on the surface of the silicon substrate 101 and is opposed to the impurity diffusion regions 107a and 107b with the capacitor dielectric film 109 therebetween. The insulating film 113 of silicon oxide is formed on the entire surface of the polysilicon film 111. A photoresist is applied to the entire surface of the insulating film 113, and is patterned, e.g., by exposure, to form an intended resist pattern 121b. Using the resist pattern 121b as a mask, the insulating film 113 and polysilicon film 111 are sequentially removed by etching.

Figure 28:
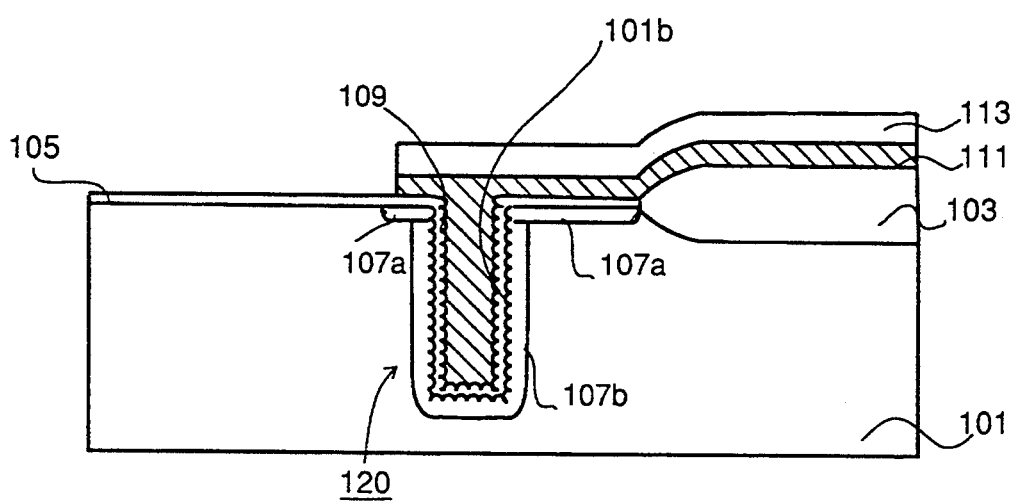

Referring to FIG. 28, by this etching the other electrode 111 of the capacitor of a polysilicon film is formed. The capacitor 120 includes the impurity diffusion regions 107a and 107b, which serve as one electrode, the capacitor dielectric film 109 and the polysilicon film 111 serving as the other electrode.

Figure 29:
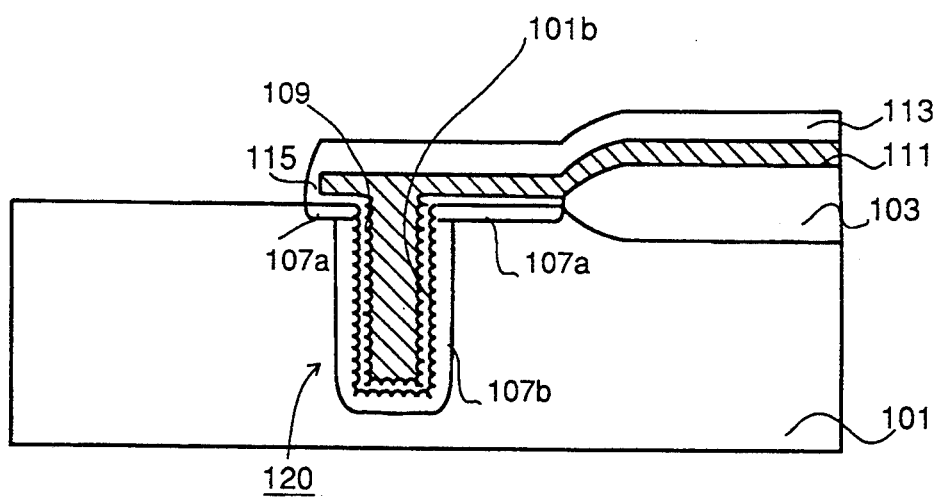

Referring to FIG. 29, the insulating film of silicon oxide is deposited on the entire surface of the silicon substrate 101 by the CVD method. Etchback is effected on the insulating film to form a side wall 115 which covers a side surface of the polysilicon film 111 forming the other electrode. This etchback also removes the thin silicon oxide film 109 from the surface of the silicon substrate 101.

Figure 30:
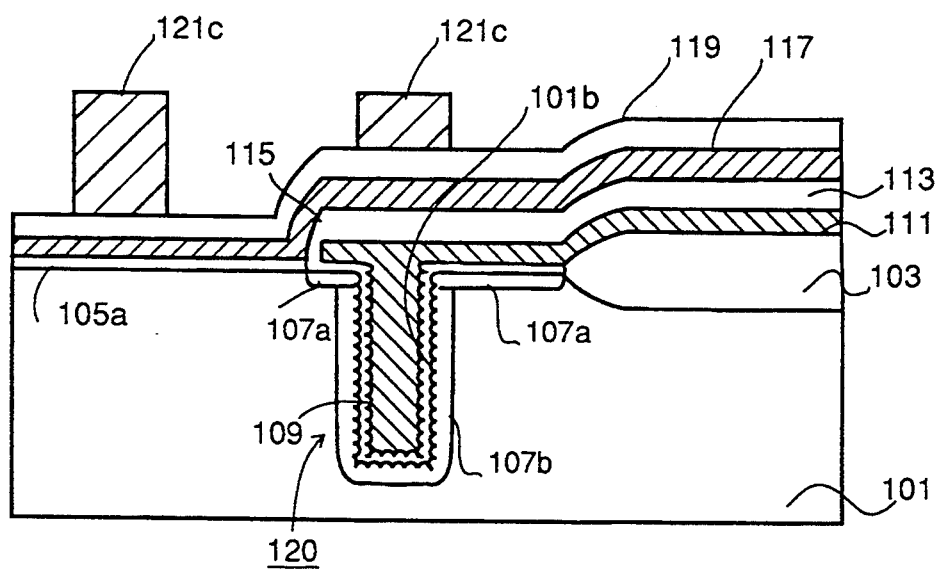

Referring to FIG. 30, the thin gate oxide film 105a is formed on the exposed surface of the silicon substrate 101. The polysilicon film 117 and silicon oxide film 119 are successively deposited on the entire surface of the silicon substrate 101 by the CVD method. A photoresist is applied to the entire surface of the silicon oxide film 119, and is patterned, e.g., by exposure to form an intended resist pattern 121c. Using this resist pattern 121c as a mask, the silicon oxide film 119 and polysilicon film 117 are successively etched.

Figure 31:
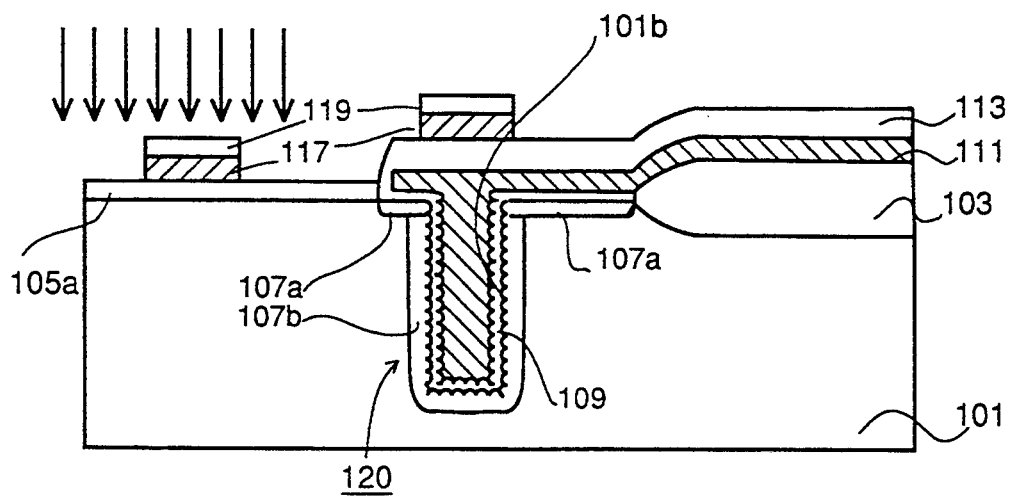

Referring to FIG. 31, by this etching the gate electrode 117 of polysilicon is formed. Ions are implanted into the surface of the silicon substrate 101.

Figure 32:
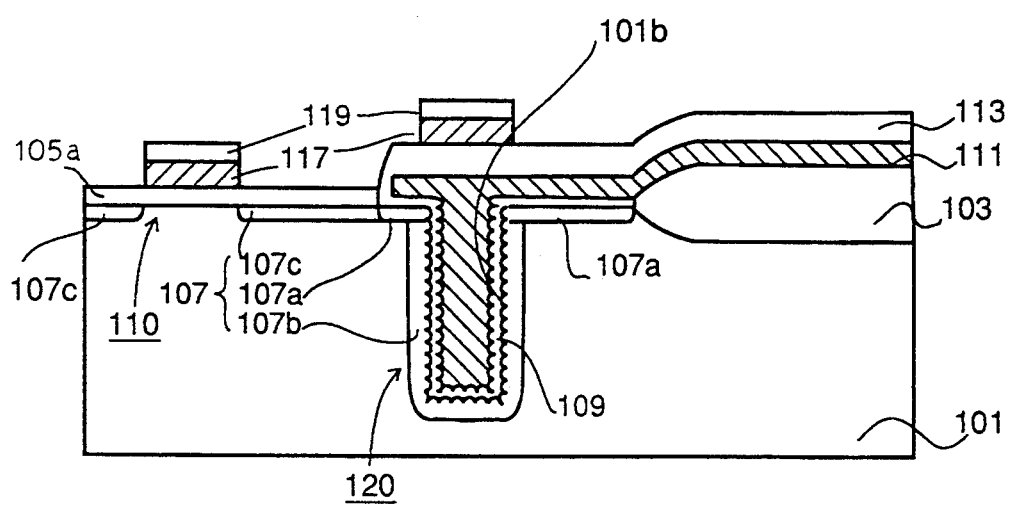

Referring to FIG. 32, by this ion-implantation the pair of impurity regions 107c are formed at regions in the silicon substrate 101 which are located at opposite sides of a region under the gate electrode 117. One of the paired impurity diffusion regions 107c is in contact with the impurity diffusion region 107a forming one electrode. Thus, the impurity diffusion region 107c is electrically connected to the impurity diffusion region 107a. The MOS transistor 110 is formed of the pair of impurity diffusion regions 107c, which form the source/drain regions, as well as the gate oxide film 105a and the gate electrode 117. This MOS transistor 110 and the capacitor 120 form the memory cell.

The semiconductor memory device of the second embodiment is manufactured as described above.

In the semiconductor memory device of the second embodiment, as shown in FIG. 20, the impurity diffusion regions 107a and 107b serving as one electrode have the uneven surfaces which are rougher than the surface of the silicon substrate 101. This increases areas of their surfaces opposed to the polysilicon film 111 forming the other electrode of the capacitor. Therefore, the capacity of the capacitor 120 increases, compared with that of the conventional capacitor having relatively flat opposed surfaces.

In the manufacturing methods of the first and second embodiments described above, the polysilicon film having the relatively large surface roughness is formed under the predetermined conditions, and then is removed by etching, so that the relatively rough unevenness can be formed at the surface of the silicon substrate with good controllability.

Now, a semiconductor device of a third embodiment having a local interconnection layer will be described below.

Figure 33:
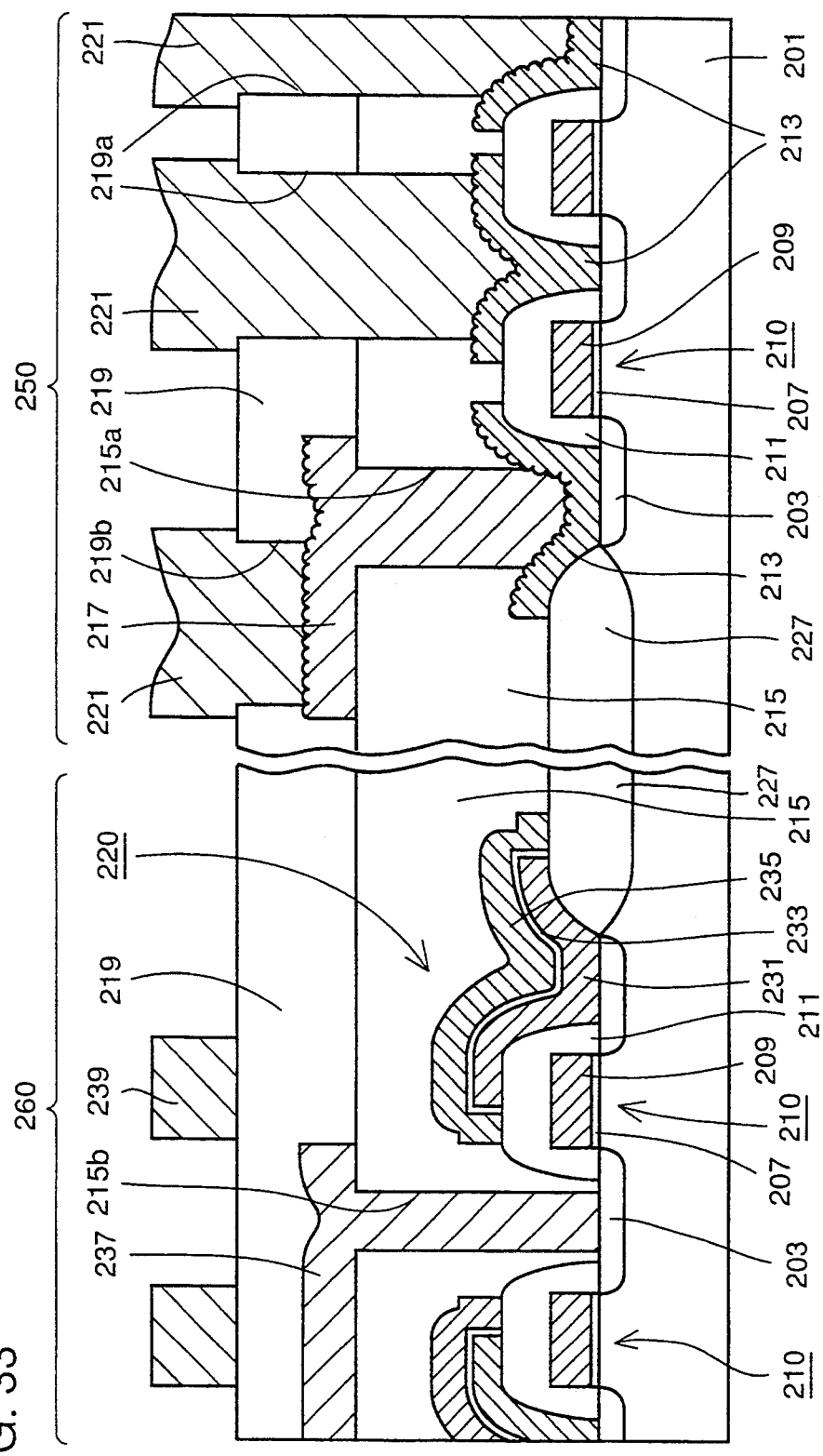
FIG. 33 is a schematic cross section showing a semiconductor device of a third embodiment of the invention.

Referring to FIG. 33, in a memory cell portion 260, there are formed a plurality of memory cells, which include MOS transistors 210 and capacitors 220, at regions in a silicon substrate 201 isolated by isolating oxide films 227.

The MOS transistor 210 includes a pair of source/drain diffusion regions 203, a gate oxide film 207 and a gate electrode 209. The pair of source/drain diffusion regions 203 are formed at the surface of the silicon substrate 201 with a predetermined space between each other. On a region between the source/drain diffusion regions 203 the gate electrode 209 is formed with the gate oxide film 207 therebetween. The gate electrode 209 is covered with an insulating film 211. One of the source/drain diffusion regions 203 is electrically connected to the capacitor 220.

The capacitor 220 includes a lower electrode (storage node) 231, a capacitor dielectric film 233 and an upper electrode (cell plate) 235. The lower electrode 231 is in contact with the source/drain diffusion region 203. The capacitor dielectric film 233 covers the lower electrode 231. The upper electrode 235 covers the lower electrode 231 with the capacitor dielectric film 233 therebetween.

The memory cells including MOS transistors 210 and capacitors 220 are covered with an interlayer insulating film 215. The interlayer insulating film 215 is provided with a contact hole 215b, through which the surface of the other of the source/drain diffusion regions 203 is partially exposed. An interconnection layer 237 has a portion located in the contact hole 215b and in contact with the source/drain diffusion region 203. The interconnection layer 237 is covered with an insulating film 219, on the surface of which is formed an interconnection 239 patterned into an intended configuration.

In a peripheral circuit portion 250, the surface of the silicon substrate 201 is substantially flat and has a first surface roughness. The plurality of MOS transistors 210 are formed in the regions of the silicon substrate 201 isolated by the isolating oxide films 227.

Similarly to the memory cell portion 260, the MOS transistor 210 includes the pair of source/drain diffusion regions 203, gate oxide film 207 and gate electrode 209. The gate electrode 209 is covered with the insulating film 211.

A first local interconnection layer 213, which has portions located over the insulating film 211 or isolating oxide film 227, is in contact with each of the source/drain diffusion regions 203. The first local interconnection layer 213 has an uneven surface which has a second surface roughness larger than that of the surface of the silicon substrate 201. The MOS transistor 210 and the first local interconnection layer 213 are covered with the interlayer insulating layer 215.

The interlayer insulating layer 215 is provided with a contact hole 215a through which the surface of the first local interconnection layer 213 is partially exposed. A second local interconnection layer 217 is in contact with each first local interconnection layer 213 through the contact hole 215a. The second local interconnection layer 217 has an uneven surface, which has a second surface roughness larger than that of the surface of the silicon substrate 201. The second local interconnection layer 217 is covered with the insulating film 219 formed on the entire surface of the interlayer insulating film 215.

The insulating film 219 and interlayer insulating film 215 are provided with a contact hole 219a, which penetrates these films and exposes a part of the surface of the first local interconnection layer 213. The insulating film 219 is also provided with a contact hole 219b through which the surface of the second local interconnection layer 217 is partially exposed. There is also formed an aluminum (Al) interconnection layer 221, which is in contact with the first local interconnection layer 213 through the contact hole 219a. There is also formed an aluminum interconnection layer 221 which is in contact with the second local interconnection layer 217 through the contact hole 219b.

Then, a manufacturing method of the peripheral circuit portion of the semiconductor device shown in FIG. 33 will be described below.

Figure 34:
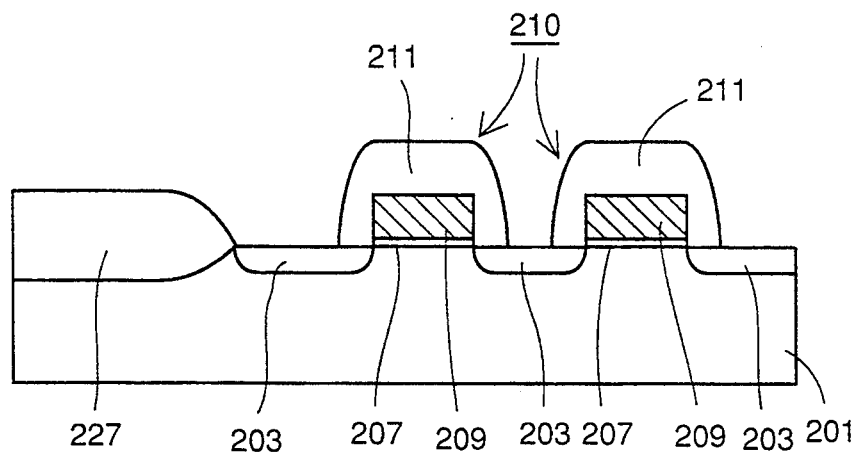
FIGS. 34–42 are schematic cross sections showing steps of a manufacturing method of a semiconductor device of a third embodiment of the invention, respectively.

Referring to FIG. 34, the MOS transistor 210, which includes the pair of source/drain diffusion regions 203, the gate oxide film 207 and the gate electrode 209, is formed in the region of the silicon substrate 201 isolated by the isolating oxide film 227. Also, the gate electrode 209 is covered with the insulating film 211.

Figure 35:
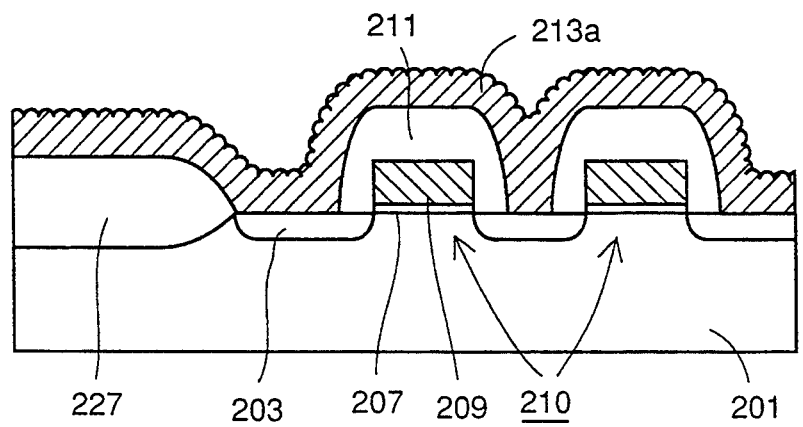

Referring to FIG. 35, a polysilicon film 213a, which is in contact with source/drain diffusion regions 203, is formed on the entire surface of the silicon substrate 201. The polysilicon film 213a is formed, e.g., by the reduced pressure CVD method under the conditions of a temperature between 540° and 580° C., a pressure of 1 Toor, and reactive gas of silane ($SiH_4$) diluted with helium (He) at a flow rate of 20%. The surface of the polysilicon film 213a thus formed has the unevenness, in which hemispherical portions between 80 and 100 nm in diameter are formed with a difference in level between the highest and the lowest portions of the convex being in a range from about 40 to 50 nm.

Figure 36:
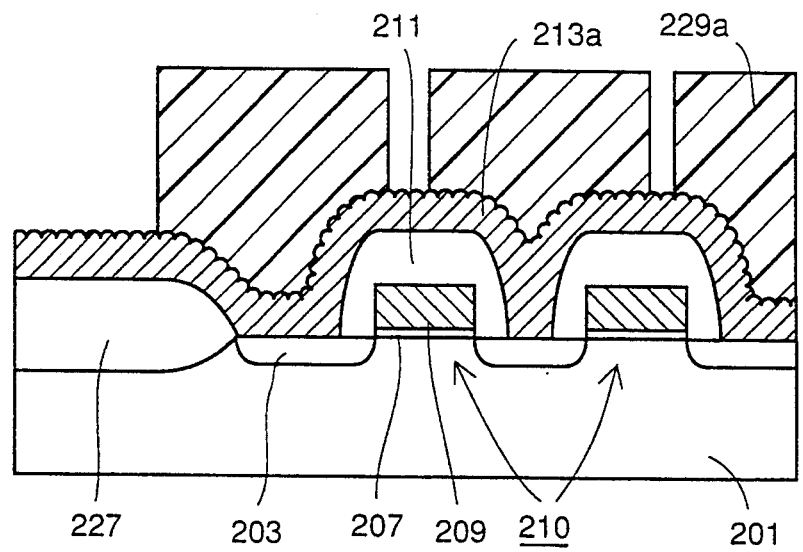

Referring to FIG. 36, a photoresist is applied to the entire surface of the polysilicon film 213a, and then is patterned, e.g., by exposure to form an intended resist pattern 229a. Using this resist pattern 229a as a mask, the polysilicon film 213a is etched.

Figure 37:
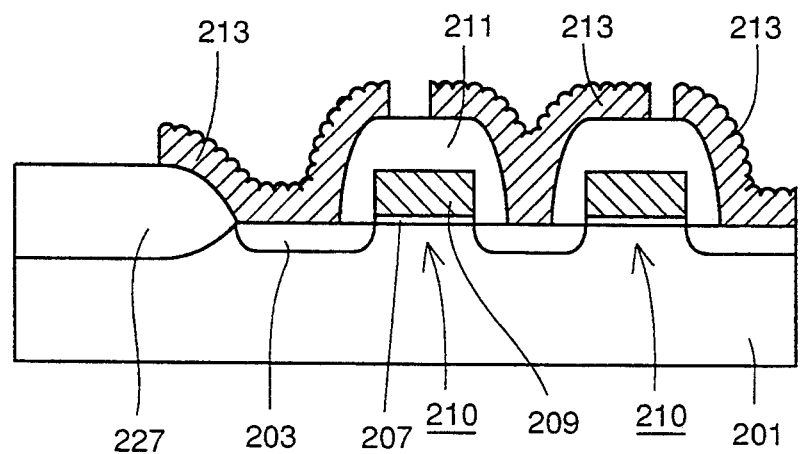

Referring to FIG. 37, by this etching the first local interconnection layers 213 is formed, which is in contact with the source/drain diffusion regions 203, has the relatively rough surface and has a portion located over the isolating oxide film 227 or insulating film 211.

Figure 38:
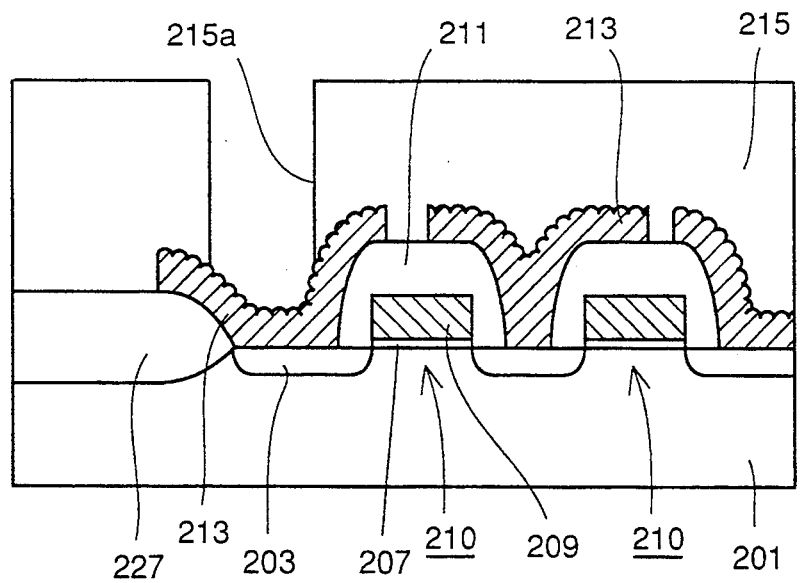

Referring to FIG. 38, the interlayer insulating film 215, which covers the MOS transistor 210 and first local interconnection layers 213, is formed on the entire surface of the silicon substrate 201. A flattening or smoothing treatment is applied to the interlayer insulating film 215. The contact hole 215a is formed in the interlayer insulating film 215, e.g., by photolithography or RIE. The surface of the local interconnection layer 213 is partially exposed through the contact hole 215a.

Figure 39:
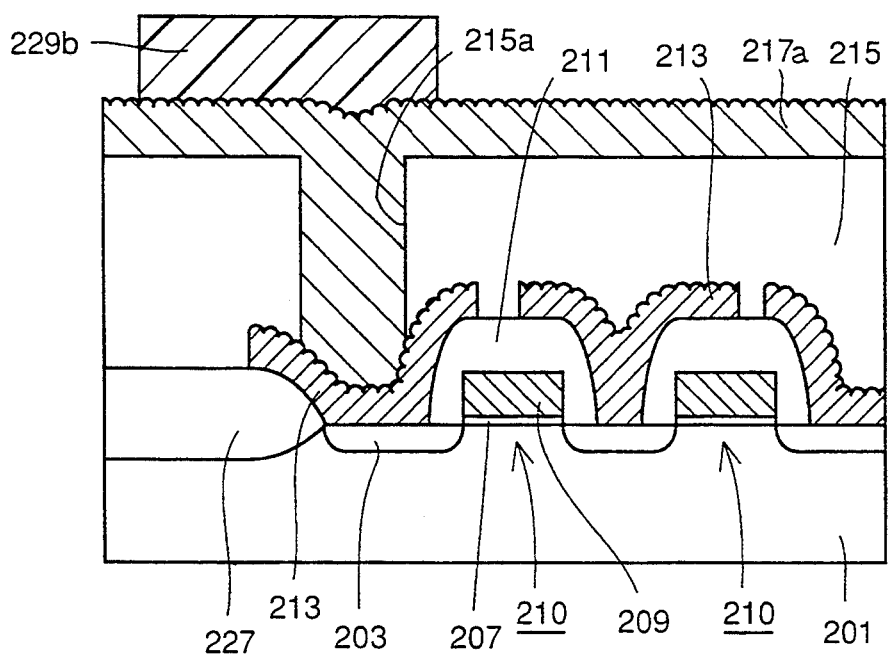

Referring to FIG. 39, a polysilicon film 217a, which is in contact with the first local interconnection layer 213 through the contact hole 215a, is formed on the surface of the interlayer insulating film 215. This polysilicon film 217a is formed under the same conditions as that of the step shown in FIG. 29 for forming the polysilicon film 213a. Therefore, the polysilicon film 217a also has the uneven surface which is rougher than that of the silicon substrate 201. A photoresist is applied to the entire surface of the polysilicon film 217a, and then is patterned, e.g., by exposure to form a resist pattern 229b. Using the resist pattern 229b as a mask, the polysilicon film 217a is etched.

Figure 40:
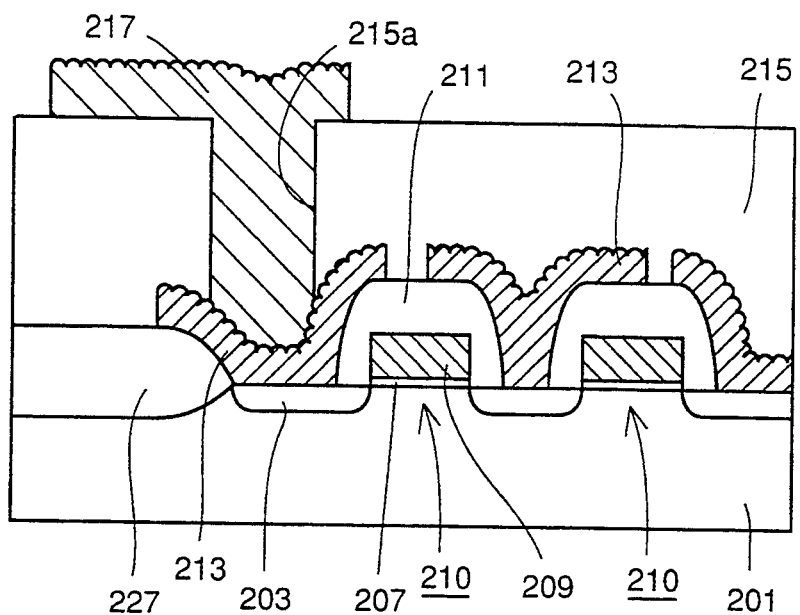

Referring to FIG. 40, by this etching the second local interconnection layer 217 which is in contact with the first local interconnection layer 213 through the contact hole 215a is formed.

Figure 41:
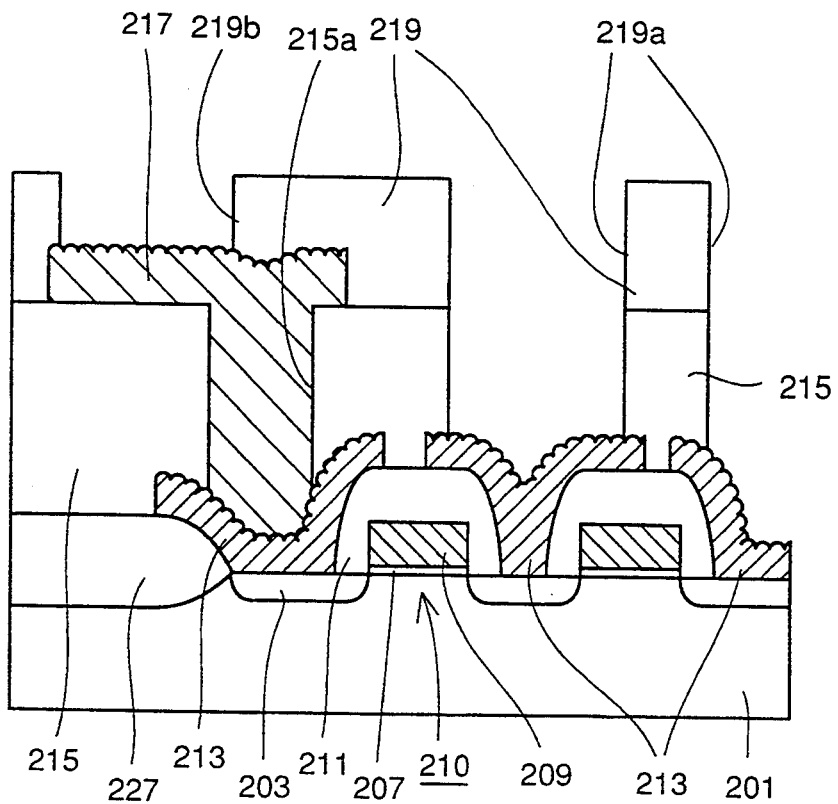

Referring to FIG. 41, the insulating film 219 covering the second local interconnection layer 217 is formed on the surface of the interlayer insulating film 215. The contact hole 219a which penetrates these two films and exposes a part of the surface of the first local interconnection layer 213 is formed in the insulating film 219 and interlayer insulating film 215 by photolithography or RIE. The contact hole 219b through which the surface of the second local interconnection layer 217 is partially exposed is formed in the insulating film 219 by photolithography or RIE.

Figure 42:
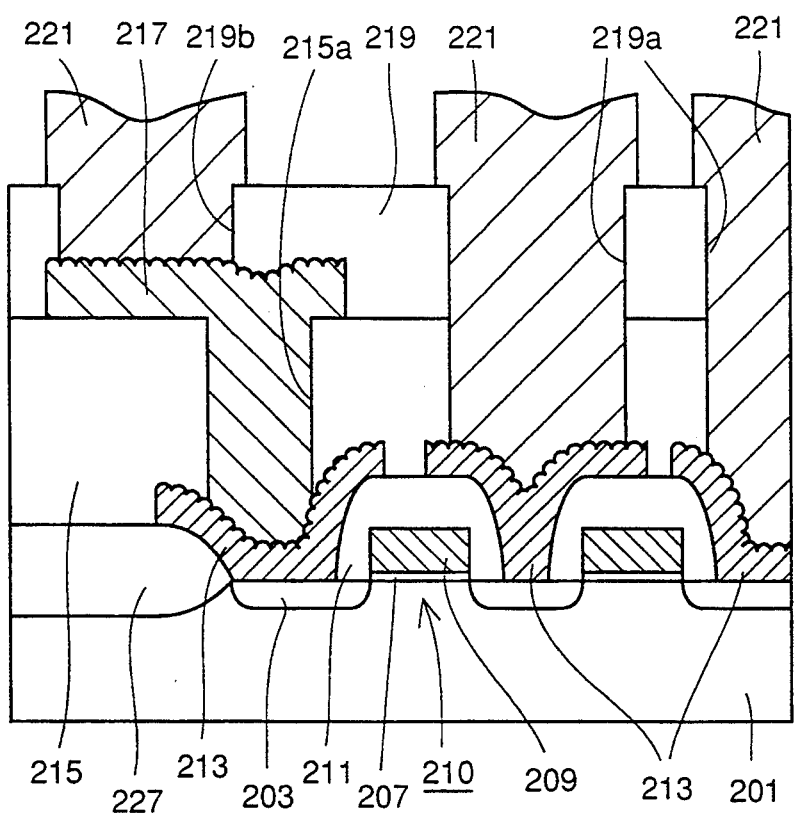
Figure 43:
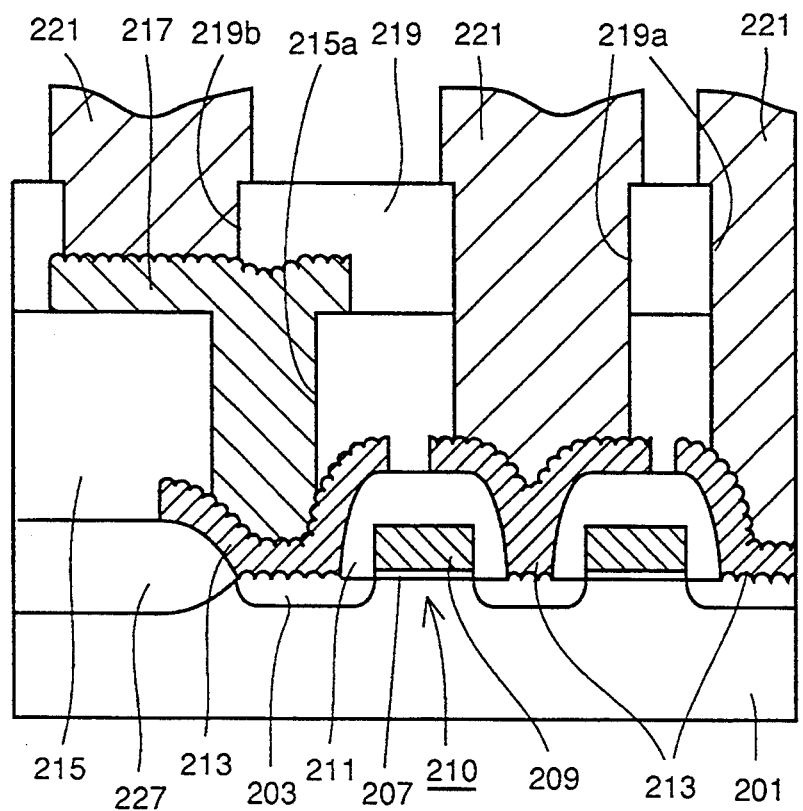
FIG. 43 is a cross section schematically showing a structure in which a contact portion between the substrate and the local interconnection layer is made rough in the semiconductor device in accordance with the third embodiment of the present invention.

Referring to FIG. 42, there is formed an aluminum layer, which is in contact with a portion of the surface of the first local interconnection layer 213 through the contact hole 219a and is in contact with the surface of the second local interconnection layer 217 through the contact hole 219b. This aluminum layer is patterned, e.g., by photolithography or RIE to form the aluminum interconnection layers 221.

An advantage of the provision of the first local interconnection layer 213 is as follows.

If the stacked capacitor 220 were used in the memory cell region 260 in a general manner, a large difference in level would be caused between the surface of the substrate 201 and capacitor 220. Therefore, a large step would be formed at the surface of the interlayer insulating film 215 covering the memory cell. In view of the fact that the aluminum interconnections are patterned on the surface of such interlayer insulating layer, the large step at the surface of the interlayer insulating film 215 is not preferable. Therefore, the flattening treatment would be required for the interlayer insulating film 215. In order to easily flatten the surface of the interlayer insulating film 215 by the flattening treatment, a larger thickness of the interlayer insulating film 215 is preferable. Therefore, the interlayer insulating film 215, which has been subjected to the flattening treatment, inevitably has a large thickness. Consequently, the contact hole, which is formed in the interlayer insulating film 215 and reaches the surface of the substrate 201, has a large depth between about 2 and 3 µm. It would be very difficult to precisely control the sizes of such contact holes.

Particularly, in the peripheral circuit portion 250, since the MOS transistors 210 are densely formed, the area of exposed surfaces of the source/drain diffusion regions 203 is small. Therefore, the contact holes reaching the surfaces of the source/drain diffusion regions 203 have small diameters, in which case a margin in registration accuracy in the photolithography would not be ensured at some positions.

The first local interconnection layer 213 serves to ensure the predetermined planar occupied area at the contact portion for the upper interconnection layer 217. Therefore, the diameter of the opening of the contact hole 215a can be designed to be larger than the exposed surface portion of the source/drain diffusion region 203, which facilitates the registration in photolithography.

However, the provision of the first local interconnection layer 213 between the upper interconnection layer 217 and source/drain diffusion region 203 increases the number of contact points, and thus increases the contact resistance.

In the third embodiment of the invention, the first local interconnection layer 213 is provided at its surface with the unevenness rougher than that of the silicon substrate 201. This increases the contact area between the upper interconnection layer 217 and first local interconnection layer 213, and thus can reduce the contact resistance.

Even in the case where the aluminum interconnection layers 221 at the upper position do not have a margin in spaces between them, the planar positions of the upper aluminum layers 221 can be varied by using the second local interconnection layers 217 as lead lines, and thus a margin in the design of the interconnections can be obtained. The provision of the second local interconnection layer 217 likewise increases the number of contact points. Therefore, it is preferable to form the relatively rough unevenness in the surface of the second local interconnection layer 217 in view of reduction of the contact resistance.

In FIG. 33, the contact surfaces between the first local interconnection layers 213 and source/drain diffusion regions 203 are relatively flat. However, this contact surfaces may be provided with relatively large unevenness. The unevenness provided on the surface of the substrate has similar shape as that described in the first and second embodiments. More specifically, the distance between adjacent protruding portions of the unevenness on the surface of the substrate 201 is within the range of from 10 nm to 200 nm, and the difference in level between adjacent protruding and depressed portions is within the range of from 5 nm to 100 nm. More preferably, the distance between adjacent protruding portions is within the range of from 80 nm to 100 nm, and the difference in level between adjacent protruding and depressed portions is within the range of from 40 nm to 50 nm.

Figure 44:
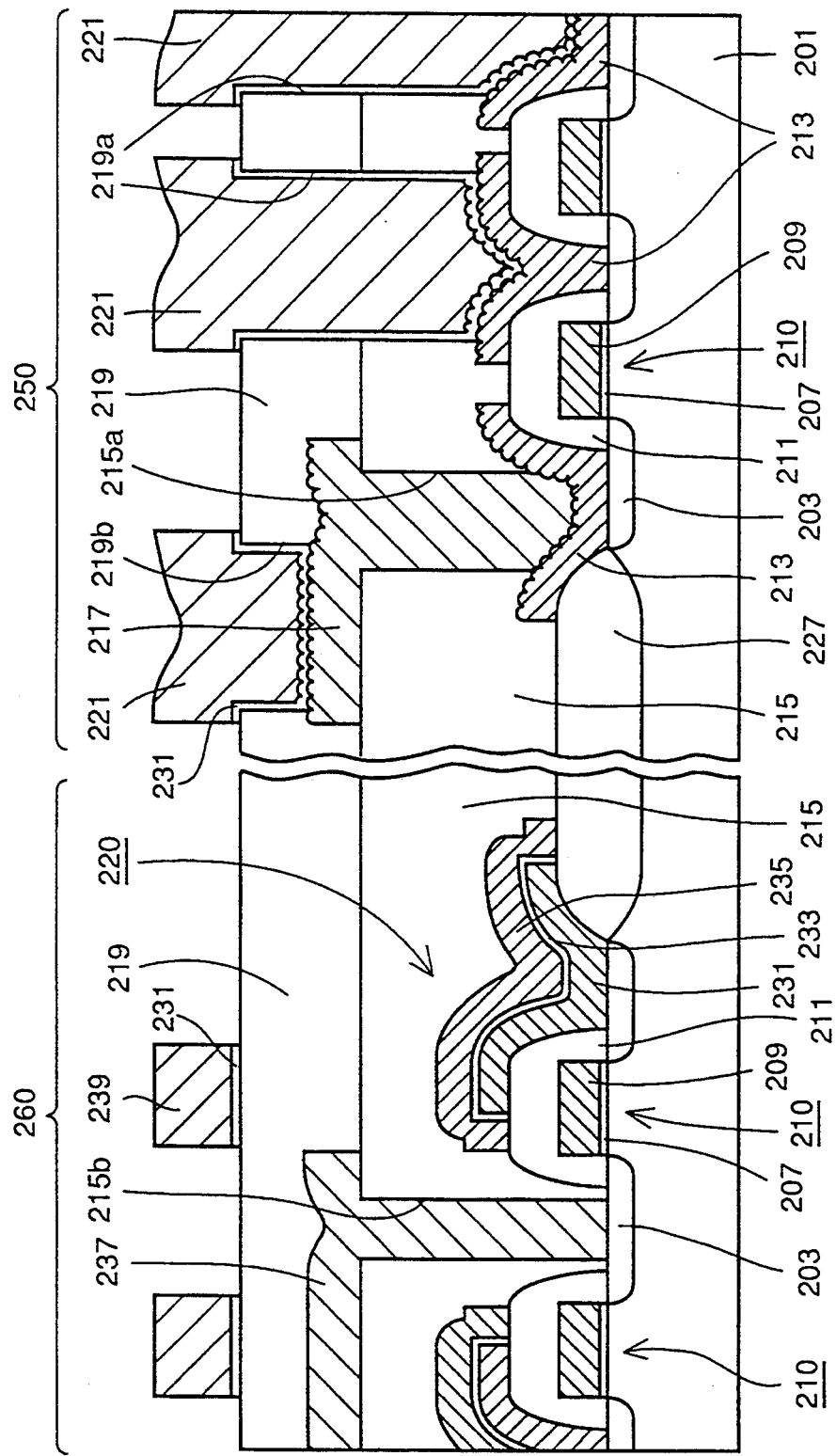
FIG. 44 is a cross section schematically showing a structure in which a barrier layer is formed in the semiconductor device in accordance with the third embodiment of the present invention.
Figure 45:
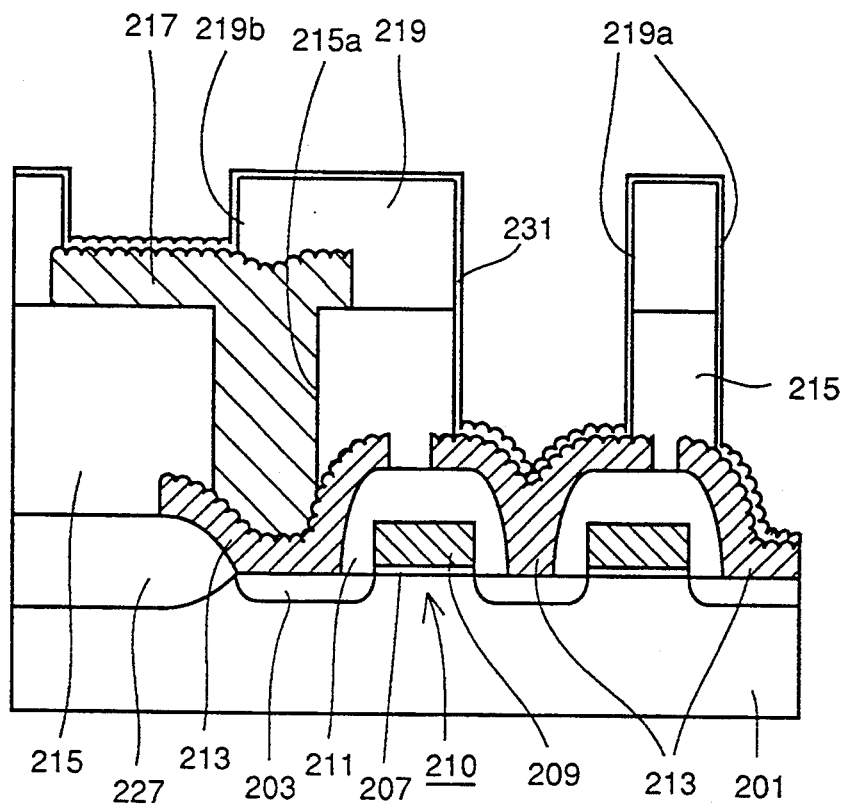
FIG. 45 is a cross section showing the step of forming a barrier layer in the semiconductor device in accordance with the third embodiment of the present invention.

In this third embodiment also, a barrier layer 231 may be formed below the aluminum layer 239 as shown in FIG. 44. When the barrier layer 231 is to be formed, the barrier layer 231 is formed on the entire surface, after the contact holes 219a and 219b are formed as shown in FIG. 45.

In the first, second and third embodiments described above, the polysilicon films having rough surfaces are utilized to increase the contact areas of the conductive regions for reducing the contact resistances and increasing the capacitor capacitances. The polysilicon film having such unevenness can also be used in the following manner for achieving a remarkable advantage.

In general, a gate of the MOS transistor is formed by patterning a conductive layer such as polysilicon film, which is formed on the entire surface of the semiconductor substrate, into an intended configuration, e.g., by photolithography. However, in the case where a step is formed at the surface of the conductive layer forming the gate electrode, it is very difficult to form the gate resist pattern having the intended configuration on the conductive layer.

Figure 46A:
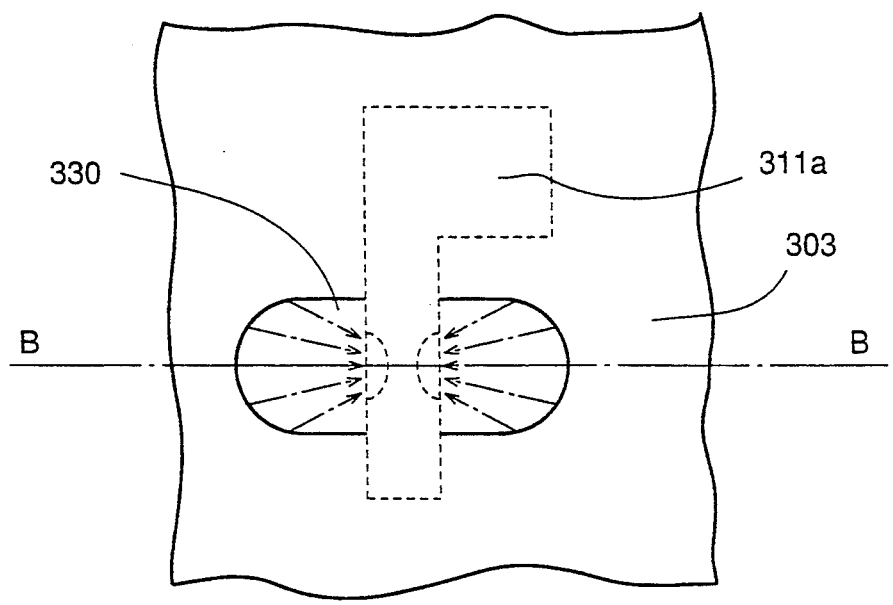
FIG. 46A is a schematic plan showing a disadvantage caused when a polysilicon film having a rough surface is not used in a gate electrode portion for forming a MOS transistor.
Figure 46B:
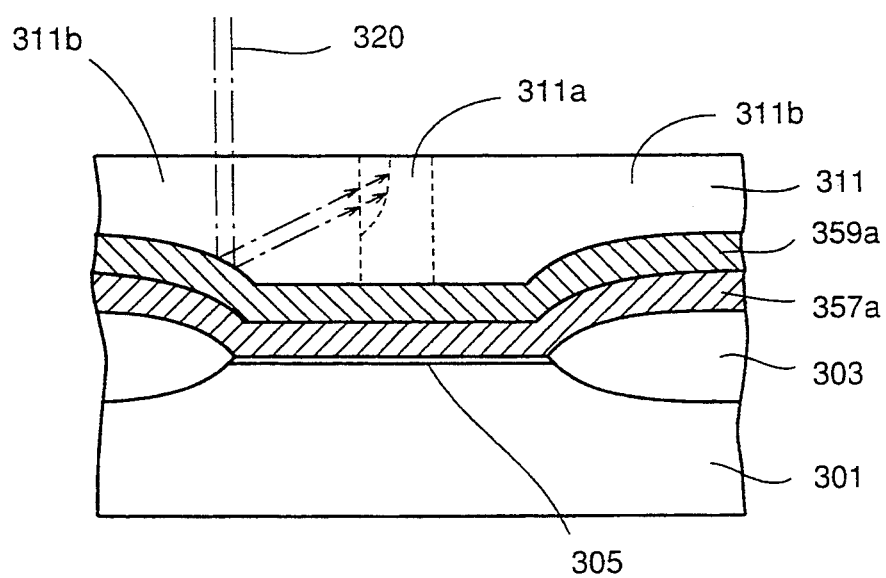
FIG. 46B is a schematic cross section taken along line B—B in FIG. 46A.

For example, as shown in FIG. 46A and 46B, a polysilicon film 357a and, e.g., a tungsten silicide (WSi) film 359a are formed on the entire surface of a silicon substrate 301, which is provided with an isolating oxide film 303, with an oxide film 305 therebetween. The polysilicon film 357a and tungsten silicide film 359a are conductive layers forming the gate electrode. The surface of the tungsten silicide film 359a has a stepped portion extending along the stepped portion formed between the lower layer, i.e., isolating oxide film 303 and the silicon substrate 301. In a step for forming the gate electrode by patterning the tungsten silicide film 359a and polysilicon film 357a, a photoresist 311 is first applied to the surface of the tungsten silicide film 359a. This photoresist 311 is patterned, e.g., by exposure to form an intended gate resistor pattern.

In the exposing processing of the photoresist 311, however, if there were a stepped surface portion below a region 311b to be exposed, a region 311a not to be exposed would also be subjected to the exposure, resulting in a defective configuration of the gate resist pattern.

Particularly, in an element forming region 330 surrounded by the isolating oxide film 303 shown in FIG. 46A, exposure beams would concentrate at a central portion of the element forming region due to the stepped portion below the photoresist 311, resulting in so-called "concave mirror phenomenon". If the concave mirror phenomenon occurs, the portion 311a of the photoresist 311, which will form the gate resist pattern, is excessively exposed. This causes defect such as lack of pattern in the gate resist pattern to a large extent, which impairs the configuration of the gate resist pattern.

If the gate resist pattern including the defect in configuration were used as a mask for etching the tungsten silicide film 359a and polysilicon film 357a in succeeding process steps, a gate electrode having a short gate length would be formed, and the gate electrode would be broken in the worst case. Even if not broken, the short gate length would be liable to cause disadvantage such as punch-through between the source/drain diffusion regions which were formed using this gate electrode as a mask.

Figure 47:
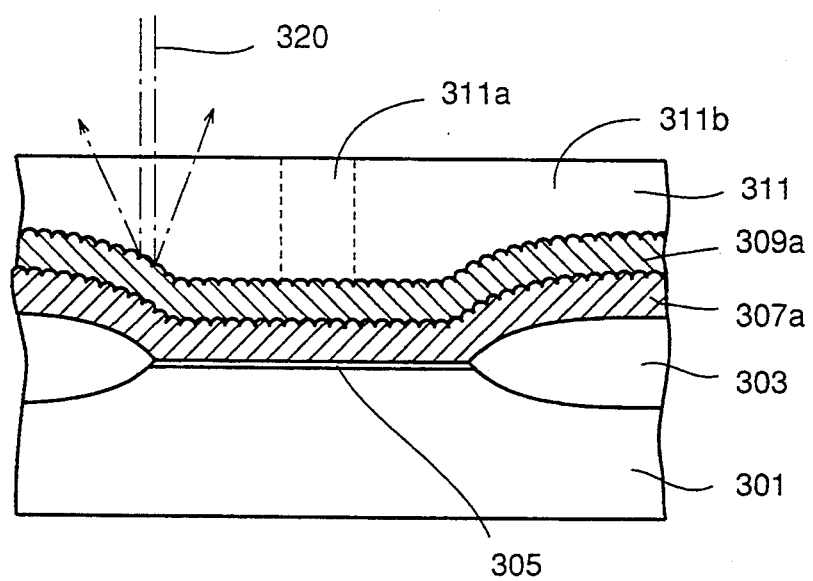
FIG. 47 is a schematic cross section showing a step in which a photoresist is exposed for forming a gate resist pattern when a polysilicon film having a rough surface is used.

In order to prevent the above disadvantages, relatively rough unevenness is formed at the surface of the polysilicon film 307a, as shown in FIG. 47. In this case, the tungsten silicide film 309a, which is formed on the relatively rough surface of the polysilicon film 307a, has a relatively rough surface reflecting the unevenness of the surface under the same. Consequently, exposure beams 320 are irregularly reflected on the surface of the tungsten silicide film 309a during the exposure of the photoresist 311 applied on the surface of the tungsten silicide 309a. The exposure beams 320 thus reflected do not enter the region 311a not to be exposed, or, even if they do, the intensity of the entered beams is small. Therefore, the defect in the pattern of the gate resist pattern is suppressed, and the configuration thereof is not impaired. As a result, the gate electrode, which is patterned with this gate resist pattern, can maintain the good configuration.

The MOS transistor, which is formed with the polysilicon film having the relatively rough surface, has the structures described below.

Figure 48A:
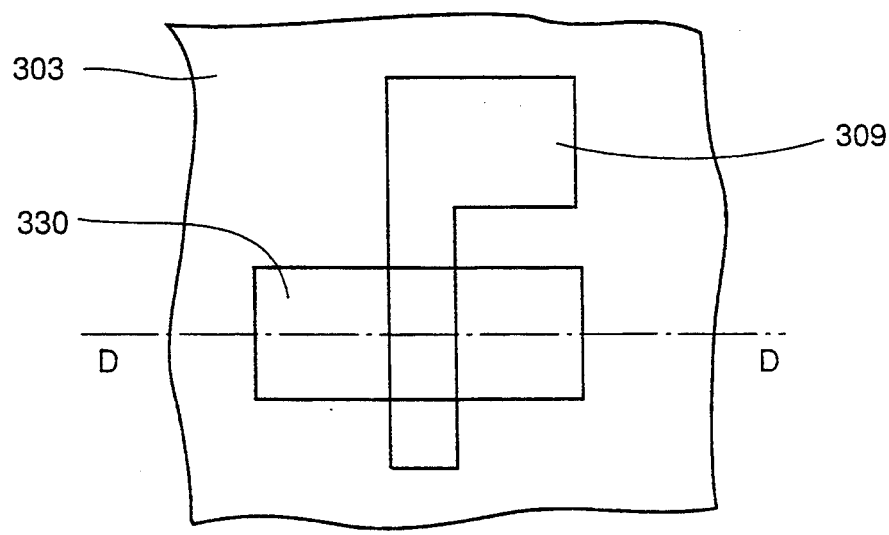
FIG. 48A is a schematic plan showing a MOS transistor provided with a gate electrode which uses a polysilicon film having a rough surface.
Figure 48B:
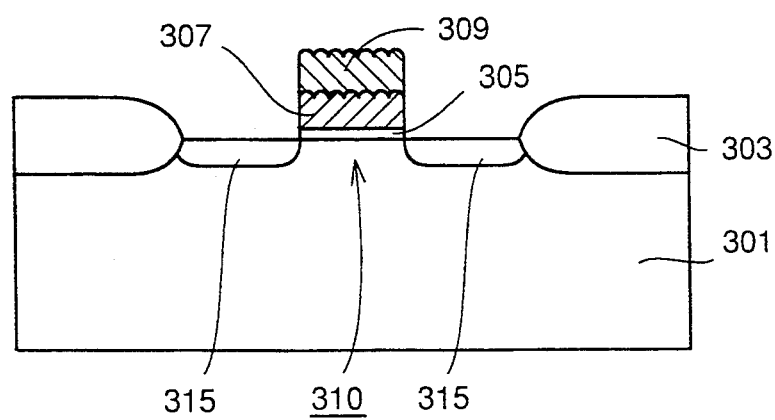
FIG. 48B is a schematic cross section taken along line D—D in FIG. 48A.
Figure 49:
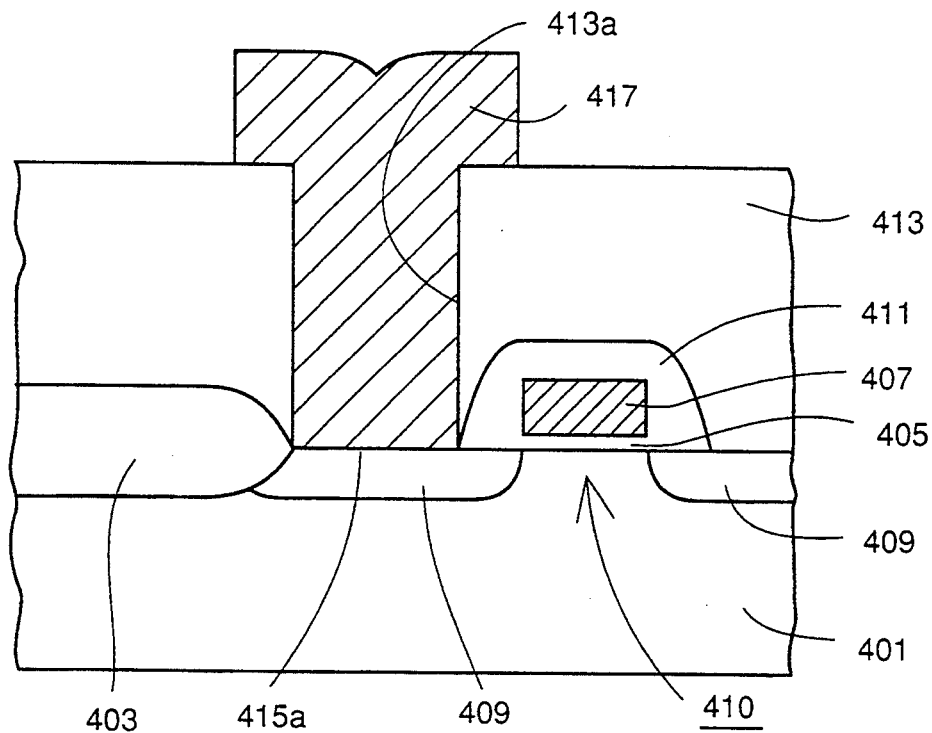
FIGS. 49-51 are schematic cross sections showing interconnection structures of semiconductor devices in the prior art, respectively.
Figure 50:
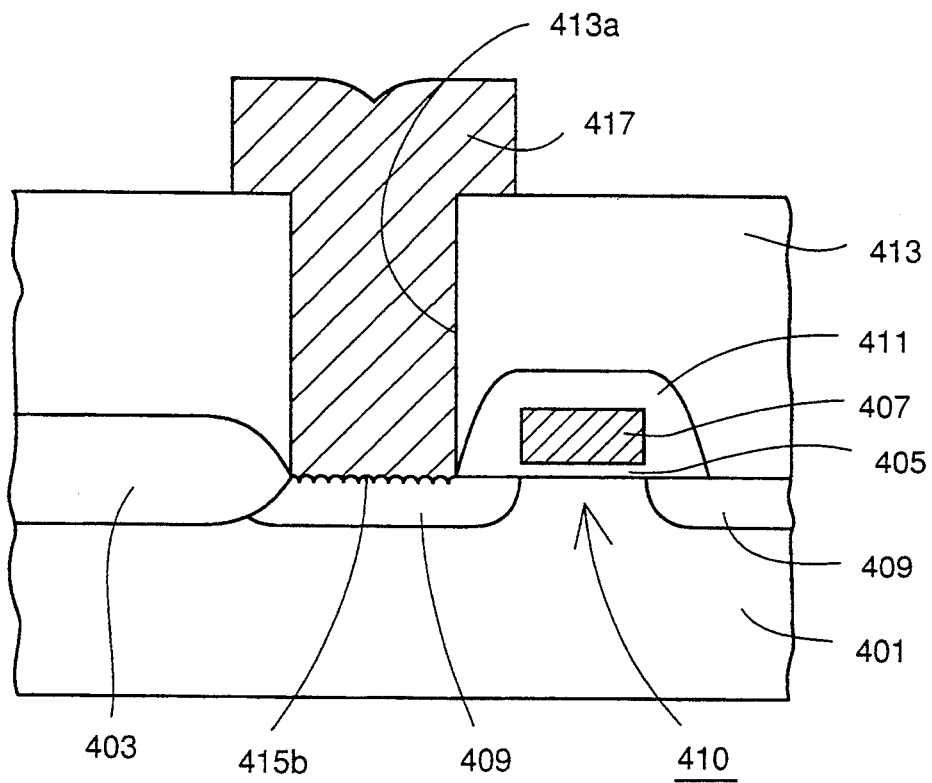
Figure 51:
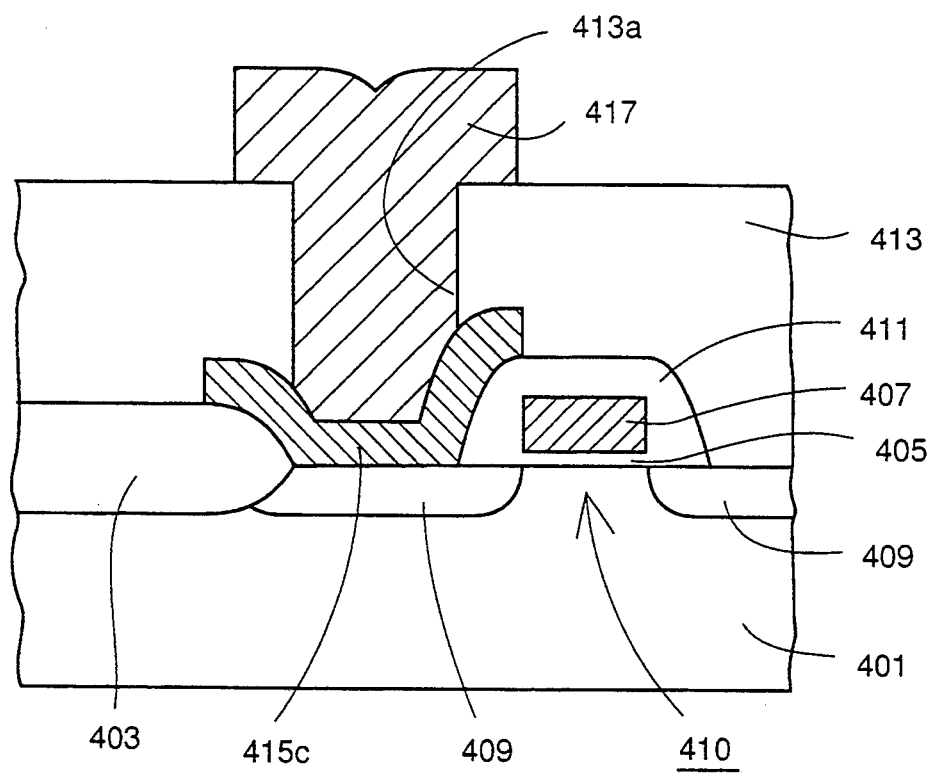
Figure 52:
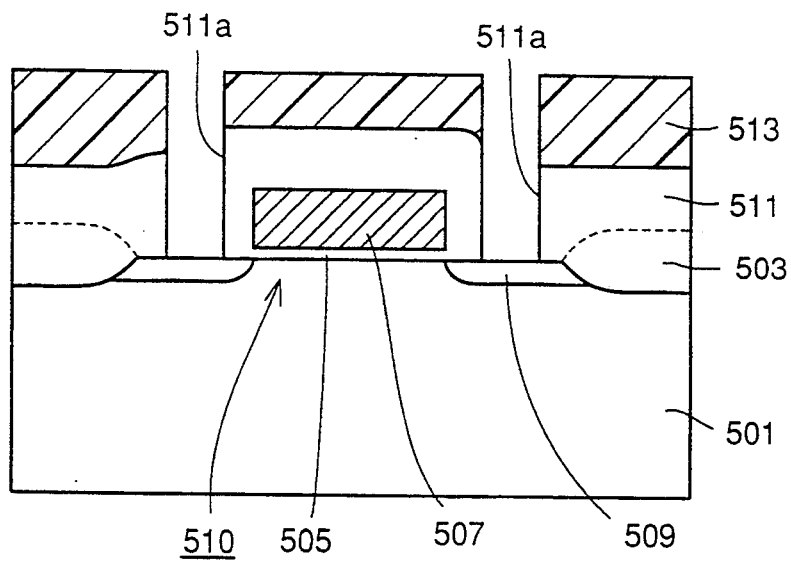
FIGS. 52-55 are schematic cross sections showing steps of a manufacturing method of an interconnection structure of a semiconductor device disclosed in a prior art reference.
Figure 53:
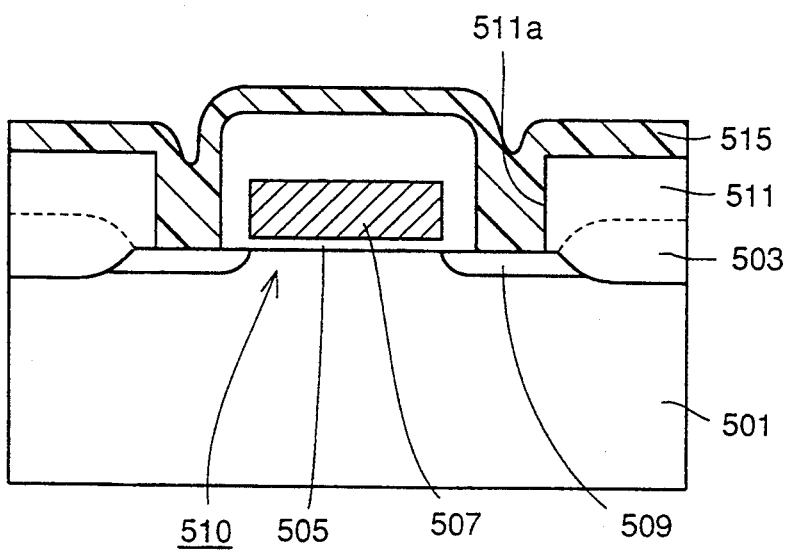
Figure 54:
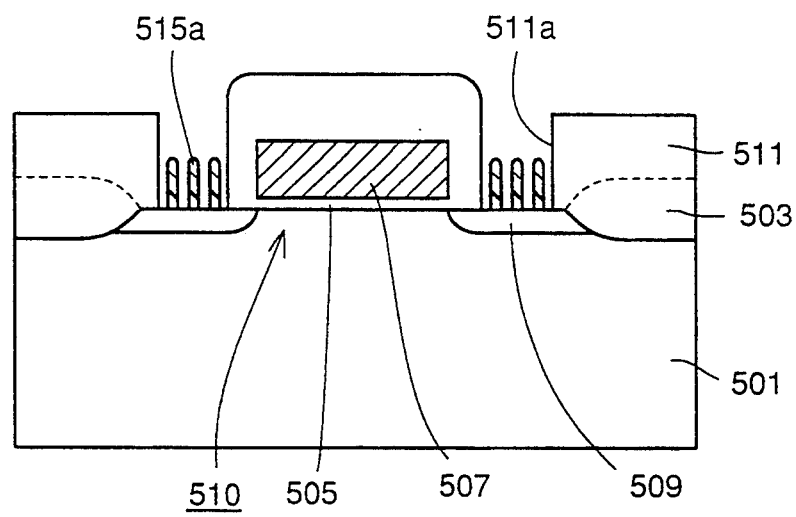
Figure 55:
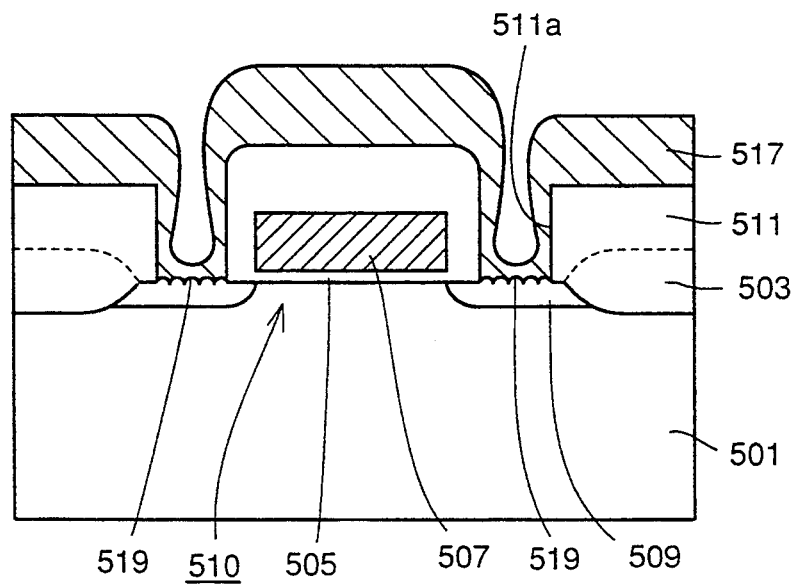
Figure 56:
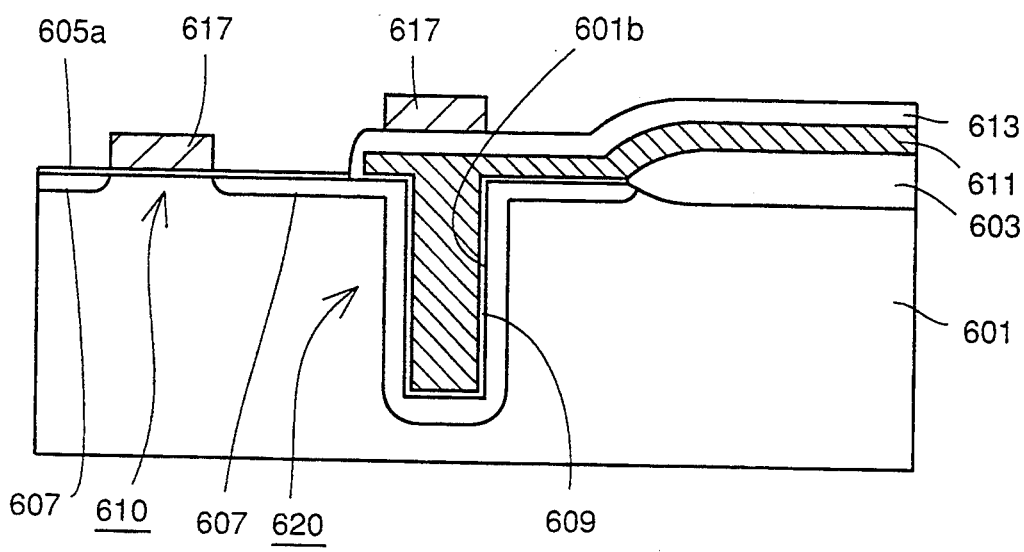
FIG. 56 is a schematic cross section of a memory cell in a DRAM having a general capacitor of a trench type.
Figure 57:
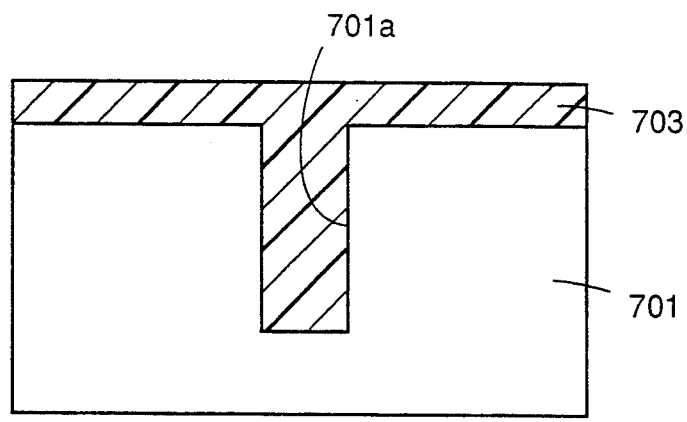
FIGS. 57-60 are schematic cross sections showing steps of a method for forming unevenness in a surface of a silicon substrate disclosed in the prior art reference.
Figure 58:
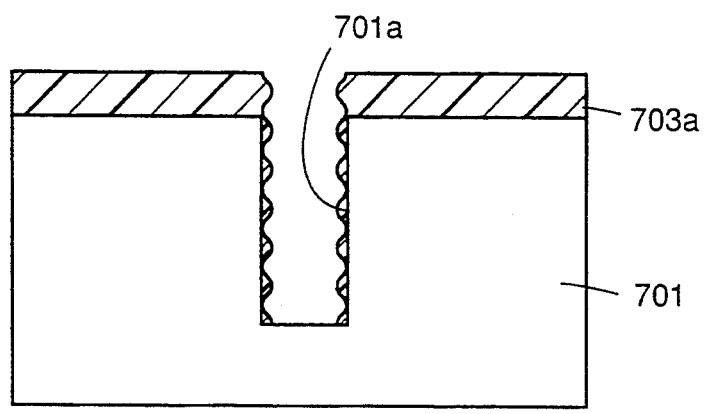
Figure 59:
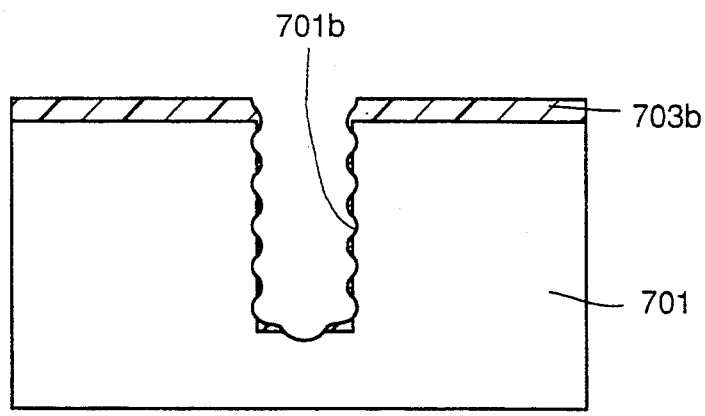
Figure 60:
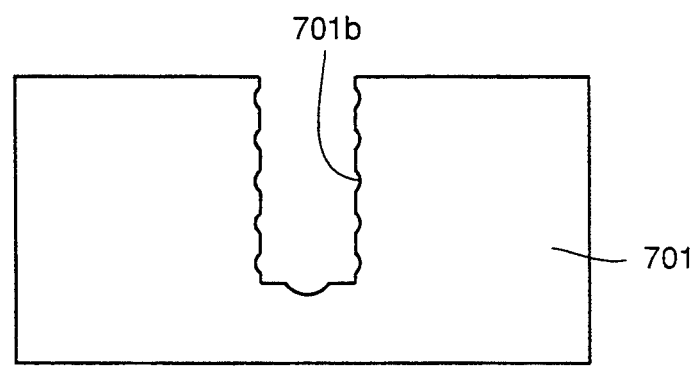

Referring to FIGS. 48A and 48B, the isolating oxide film 303 surrounding the element forming region 330 is formed in the surface of the silicon substrate 301. In the element forming region 330 a MOS transistor 310 is formed, which includes a pair of source/drain diffusion regions 315, a gate oxide film 305, and gate electrodes 307 and 309. The pair of the source/drain diffusion regions 315 are formed at the surface of the silicon substrate 301 with a predetermined space between each other. The gate electrodes 307 and 309 are formed on the region located between the pair of source/drain diffusion regions 315, with the gate oxide film 305 therebetween.

The gate electrode is formed of the polysilicon film 307 and, e.g., the tungsten silicide film 309. The surface of the polysilicon film 307 has the unevenness rougher than the that of the surface of the silicon substrate 301. The shape of the unevenness is similar to that of the first to third embodiments. Therefore, the surface of the tungsten silicide film 309, which is formed on the surface of the polysilicon film 307, is provided with the relatively rough unevenness reflecting the surface configuration of the polysilicon film 307.

The gate electrode is not limited to the two-layered structure including polysilicon film 307 and tungsten silicide film 309, and it may be formed of the polysilicon film 307 and other metal film. The gate electrode may be formed of a single layer, i.e., polysilicon film 307.

The polysilicon film 307a shown in FIG. 38 may be formed by a method similar to that for forming the polysilicon films 25 and 125 in the first and second embodiments, but not limited thereto.

In general, two conductive regions having uneven contact portions can contact with each other more tightly. Also for this reason, the contact resistance between the two conductive regions can be further reduced.

In accordance with the method of manufacturing a semiconductor device in accordance with one aspect of the present invention, a coating layer having relatively large surface roughness is formed to cover the surface of the conductive region and then removed by etching, so that the surface shape of the coating layer can be accurately reflected on the surface of the conductive region. Therefore, the surface roughness of the conductive region after the coating layer is removed by etching can be made the desired second surface roughness with high controllability.

In the method of manufacturing an interconnection structure of a semiconductor device in accordance with another aspect of the present invention, a coating layer having relatively large surface roughness is formed to cover the surface of the conductive region, and then it is removed by etching, so that the shape of the surface of the coating layer can be accurately reflected on the surface of the conductive region. Therefore, the surface roughness of the conductive region after the coating layer is removed by etching can be made to the desired second surface roughness with high controllability.

The interconnection layer is formed to be in contact with the surface of the conductive region having the second surface roughness larger than the first surface roughness. Therefore, even if the planar area of occupation at the contact portion is reduced, a prescribed contact area is assured.

The interconnection structure of each of the semiconductor devices in accordance with the three aspect of the present invention manufactured in accordance with the above described methods has a structure which can prevent increase of contact resistance derived from higher degree of integration.

In accordance with the method of manufacturing a semiconductor memory device in accordance with a still further aspect of the present invention, a coating layer having relatively large surface roughness is formed to cover the surface of the conductive region and then removed by etching, so that the shape of the surface of the coating layer can be accurately reflected on the surface of the conductive region. Therefore, the surface roughness of the conductive region after the coating layer is removed by etching can be made a desired second surface roughness with high controllability.

In addition, since the surface of the conductive region formed at the inner periphery of the trench has the second surface roughness which is larger than the first surface roughness. Therefore, opposing areas of the electrodes of the trench type capacitor formed by the conductive region and the electrode layer can be increased.

In accordance with the method of manufacturing a semiconductor device in accordance with a still further aspect of the present invention, a conductive layer having relatively large surface roughness can be formed. The conductive layer can be formed by selecting prescribed conditions by using, for example, reduced pressure CVD method, and the control of the surface roughness of the coating layer is relatively easy. Therefore, the conductive layer having the second surface roughness can be formed with high controllability.

In the semiconductor device in accordance with the aspect of the present invention manufactured by the above described method, a conductive layer is provided between the conductive region and the interconnection layer. The surface of the conductive layer has a second surface roughness which is larger than the first surface roughness. Therefore, at the contact between the conductive layer and the interconnection layer, the contact area with the interconnection layer is increased when it has the second surface roughness, as compared with the case when it has the first surface roughness, and therefore the contact resistance can be reduced.

In the method of patterning the conductive layer in accordance with a still further aspect of the present invention, the conductive layer which is patterned is formed to have relatively large surface roughness. Therefore, light reflected from the conductive layer is scattered, preventing concentration of the reflected light. Accordingly, degradation of the shape of the resist pattern caused by local increase of the intensity of the reflected light can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnection structure of a semiconductor device, comprising:
   a semiconductor substrate having a main surface having a first surface roughness;
   a conductive region formed in the main surface of said semiconductor substrate and having a surface portion which has a second surface roughness larger than said first surface roughness;
   an insulating layer formed on said conductive region and having an opening reaching said surface portion having the second surface roughness;
   a conductive layer formed on a sidewall of said opening of said insulating layer; and
   an interconnection layer formed to be in contact with said surface portion of said conductive region having the second surface roughness, and formed of a material different from the material of said conductive layer.

2. The interconnection structure of the semiconductor device according to claim 1, wherein said conductive layer includes polycrystalline silicon.

3. The interconnection structure of a semiconductor device according to claim 1, wherein said interconnection layer includes aluminum.

4. An interconnection structure of a semiconductor device, comprising:
   a semiconductor substrate having a main surface having a first surface roughness;
   a conductive region formed in the main surface of said semiconductor substrate and having a surface portion which has a second surface roughness larger than said first surface roughness;
   an insulating layer formed on said conductive region and having an opening reaching said surface portion having the second surface roughness; and
   an interconnection layer of a conductive material formed on sidewall of said opening of said insulating layer to be in contact with said surface portion having the second surface roughness of said conductive region; wherein
   the region of said interconnection layer on the main surface of said semiconductor substrate has a prescribed width, and the surface portion of said conductive region having the second surface roughness which is in contact with said interconnection layer extends below the main surface of said semiconductor substrate and has a width which is larger than the prescribed width of said interconnection layer.

5. An interconnection layer of a semiconductor device, comprising:
   a semiconductor substrate having a main surface having a first surface roughness;
   a conductive region formed in the main surface of said semiconductor substrate which has a surface portion having a second surface roughness which is larger than said first surface roughness;
   an insulating layer formed on said conductive region and having an opening reaching said surface portion having the second surface roughness; and
   an interconnection layer formed on said insulating layer to be in contact with the surface portion having the second surface roughness of said conductive region through said opening; wherein
   said second surface roughness is defined by unevenness at the surface portion of said conductive region, distance between adjacent protruding portions of said unevenness being within the range of from 10 nm to 200 nm, and difference in level between adjacent protruding and depressed portions of said unevenness being within the range of from 5 nm to 100 nm.

6. The interconnection structure of a semiconductor device according to claim 5, wherein
   said second surface roughness is defined by the unevenness of the surface portion of said conductive region, the distance between adjacent protruding portions of said unevenness being within the range of from 80 nm to 100 nm and the difference in level between adjacent protruding and depressed portions of said unevenness being within the range of from 40 nm to 50 nm.

7. The interconnection structure of a semiconductor device according to claim 5, wherein
   the difference in level between adjacent protruding and depressed portions of said unevenness is at least one fourth of the distance between adjacent protruding portions of said unevenness defining said second surface roughness.

8. A semiconductor device, comprising:
   a semiconductor substrate having a main surface having a first surface roughness;
   a conductive region formed in the main surface of said semiconductor substrate;
   a conductive layer formed to be in contact with said conductive region and having a surface portion which has a second surface roughness larger than said first surface roughness;
   an insulating layer formed on said conductive layer and having an opening reaching the surface portion having the second surface roughness of said conductive layer;

an interconnection layer formed on said insulating layer to be in contact with the surface portion having the second surface roughness of said conductive layer through said opening; wherein said second surface roughness is defined by unevenness of the surface portion of said conductive layer, distance between adjacent protruding portions of said unevenness being within the range of from 10 nm to 200 nm, and difference in level between adjacent protruding and depressed portions of said unevenness being within the range of from 5 nm to 100 nm.

9. The semiconductor device according to claim 8, wherein said second surface roughness is defined by the unevenness of the surface portion of said conductive layer, the distance between adjacent protruding portions of said unevenness being within the range of from 80 nm to 100 nm, and the difference in level between adjacent protruding and depressed portions of said unevenness being within the range of from 40 nm to 50 nm.

10. The semiconductor device according to claim 8, wherein the difference in level between adjacent protruding and depressed portions of said unevenness is at least one fourth of the distance between adjacent protruding portions of said unevenness defining said second surface roughness.

11. The semiconductor device according to claim 8, wherein said conductive layer includes polycrystalline silicon.

12. The semiconductor device according to claim 8, wherein said conductive layer includes a first conductive layer and a second conductive layer, said first conductive layer is formed to be in contact with said conductive region and having a surface portion which has a third surface roughness larger than said first surface roughness, said second conductive layer is formed to be in contact with the surface portion having the third surface roughness of said first conductive layer, and having said surface portion having said second surface roughness, and said third surface roughness is defined by unevenness of the surface portion of said first conductive layer, distance between adjacent protruding portions of said unevenness being within the range of from 10 nm to 200 nm, and difference in level between adjacent protruding and depressed portions of said unevenness being within the range of from 5 nm to 100 nm.

13. The semiconductor device according to claim 12, wherein said third surface roughness is defined by the unevenness of the surface portion of said first conductive layer, the distance between adjacent protruding portions of said unevenness being within the range of from 80 nm to 100 nm, and difference in level between adjacent protruding and depressed portions of said unevenness being within the range of from 40 nm to 50 nm.

14. The semiconductor device according to claim 12, wherein the difference in level between adjacent protruding and depressed portions of said unevenness is at least one fourth of the distance between adjacent protruding portions of said unevenness defining said third surface roughness.

15. The semiconductor device according to claim 12, wherein said first and second conductive layers include a silicon layer.

16. The semiconductor device according to claim 8, wherein said conductive region has a surface portion having a fourth surface roughness which is larger than said first surface roughness at a portion which is in contact with said conductive layer, and said fourth surface roughness is defined by unevenness of the surface portion of said conductive region, the distance between adjacent protruding portions of said unevenness being within the range of from 10 nm to 200 nm, and difference in level between adjacent protruding and depressed portions of said unevenness being within the range of from 5 nm to 100 nm.

* * * * *